US012757394B2

(12) United States Patent
Wang et al.

(10) Patent No.: US 12,757,394 B2
(45) Date of Patent: Oct. 6, 2026

(54) METHOD OF MANUFACTURING MEMORY DEVICE

(71) Applicant: Winbond Electronics Corp., Taichung City (TW)

(72) Inventors: Yu-Lung Wang, Taichung City (TW); Wen-Chieh Tsai, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 391 days.

(21) Appl. No.: 18/632,711

(22) Filed: Apr. 11, 2024

(65) Prior Publication Data

US 2024/0389321 A1 Nov. 21, 2024

(30) Foreign Application Priority Data

May 19, 2023 (TW) ................................ 112118709

(51) Int. Cl.

| | |
|---|---|
| ***H10B 41/30*** | (2023.01) |
| ***G03F 7/00*** | (2006.01) |
| ***H10P 50/00*** | (2026.01) |
| *G11C 5/02* | (2006.01) |
| *G11C 5/04* | (2006.01) |
| *G11C 5/05* | (2006.01) |

(52) U.S. Cl.

CPC ......... *H10B 41/30* (2023.02); *G03F 7/70425* (2013.01); *H10P 50/69* (2026.01); *H10P 50/73* (2026.01); *G11C 5/02* (2013.01); *G11C 5/025* (2013.01); *G11C 5/04* (2013.01); *G11C 5/05* (2013.01)

(58) Field of Classification Search

CPC .. H10B 14/30; G03F 7/70425; G11C 5/02–05
See application file for complete search history.

(56) References Cited

U.S. PATENT DOCUMENTS

| | | | |
|---|---|---|---|
| 7,700,997 | B2 | 4/2010 | Futatsuyama et al. |
| 7,701,742 | B2 | 4/2010 | Sakuma et al. |

(Continued)

FOREIGN PATENT DOCUMENTS

| | | | |
|---|---|---|---|
| TW | 202301644 | A | 1/2023 |
| TW | 202312447 | A | 3/2023 |
| TW | I824292 | B | 12/2023 |

*Primary Examiner* — David Vu
*Assistant Examiner* — Brandon C Fox
(74) *Attorney, Agent, or Firm* — Birch, Stewart, Kolasch & Birch, LLP

(57) ABSTRACT

A method of manufacturing a memory device includes providing a substrate, forming a stack layer on the substrate, and forming a hard mask layer on the stack layer. The hard mask layer has a protrusion. The method includes forming a patterned mandrel on the hard mask layer, the patterned mandrel includes a first mandrel disposed adjacent to the protrusion, a second mandrel disposed on the top surface of the protrusion, and a third mandrel. The method further includes using the patterned mandrel as a mask, the hard mask layer and the stack layer are sequentially patterned to form a dummy structure and a word line structure on the substrate. The portion of the stack layer corresponding to the first and second mandrels is formed as the dummy structure. The portion of the stack layer corresponding to the third mandrel is formed as the word line structure.

20 Claims, 19 Drawing Sheets

(56) References Cited

U.S. PATENT DOCUMENTS

| | | | | |
|---|---|---|---|---|
| 10,727,056 | B2 * | 7/2020 | Fan | H10P 76/405 |
| 11,876,048 | B2 | 1/2024 | Tsai et al. | |
| 2012/0020158 | A1 | 1/2012 | Ozaki et al. | |
| 2014/0078826 | A1 | 3/2014 | Sel et al. | |
| 2015/0060975 | A1 | 3/2015 | Nitta et al. | |
| 2024/0112915 | A1 * | 4/2024 | Kim | H10B 12/09 |
| 2025/0072081 | A1 * | 2/2025 | Wei | H10B 12/488 |

* cited by examiner

METHOD OF MANUFACTURING MEMORY DEVICE

CROSS REFERENCE TO RELATED APPLICATIONS

This Application claims priority of Taiwan Patent Application No. 112118709 filed on May 19, 2023, the entirety of which is incorporated by reference herein.

BACKGROUND OF THE INVENTION

Field of the Invention

The present disclosure relates to a semiconductor process technology, and in particular to method of manufacturing memory device.

Description of the Related Art

The critical dimensions of memory elements are gradually being scaled down as development of those memory elements advances, and the resistances of lithography processing and etching are gradually increasing. As the resolution of lithography processes approaches its theoretical limit, vendors have taken approaches such as double-patterning to overcome the optical limit and increase the integration of memory elements. However, in the existing patterning method, the dummy structure located at the end of the word line structure has a comb-shaped structure, which may unnecessarily affect the memory device and cause electrical problems.

BRIEF SUMMARY OF THE INVENTION

The embodiments of the present disclosure provide solutions to improve the comb-shaped structure of the dummy structure, thereby improving the electrical performance of the memory device.

An embodiment of the present disclosure provides a method of manufacturing a memory device, including providing a substrate. The method further includes forming a stack layer on the substrate. The method further includes forming a hard mask layer on the stack layer. The hard mask layer has a protrusion, and the protrusion extends in a first direction. The method further includes forming a patterned mandrel on the hard mask layer. The patterned mandrel includes a first mandrel, a second mandrel, and a third mandrel. The first mandrel extends in the first direction and is disposed adjacent to the protrusion. The second mandrel is disposed on the top surface of the protrusion. The third mandrel extends in a second direction. The first and second directions intersect. The method further includes using the patterned mandrel as a mask, sequentially patterning the hard mask layer and the stack layer to form a dummy structure and a word line structure separated from each other on the substrate. The portion of the stack layer corresponding to the first and second mandrels is formed as the dummy structure. The portion of the stack layer corresponding to the third mandrel is formed as the word line structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
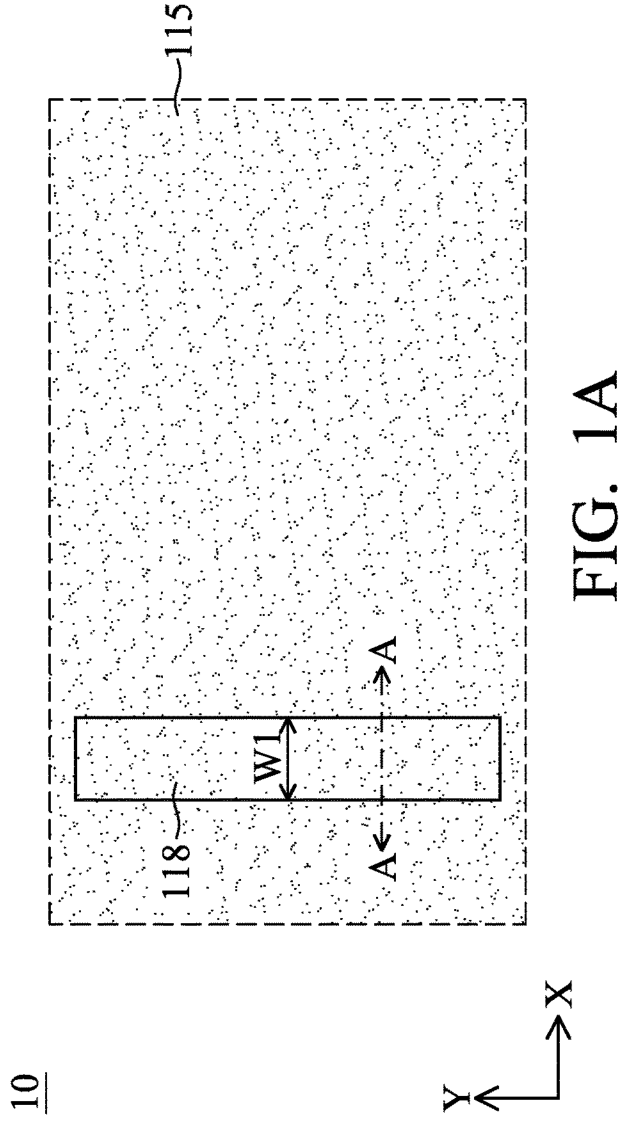
FIGS. 1A, 2, 5, 7, 9, 12, 14, 17, 19, and 22 illustrate partial top views at intermediate stages of manufacturing the semiconductor structure according to the embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during the manufacturing process, as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
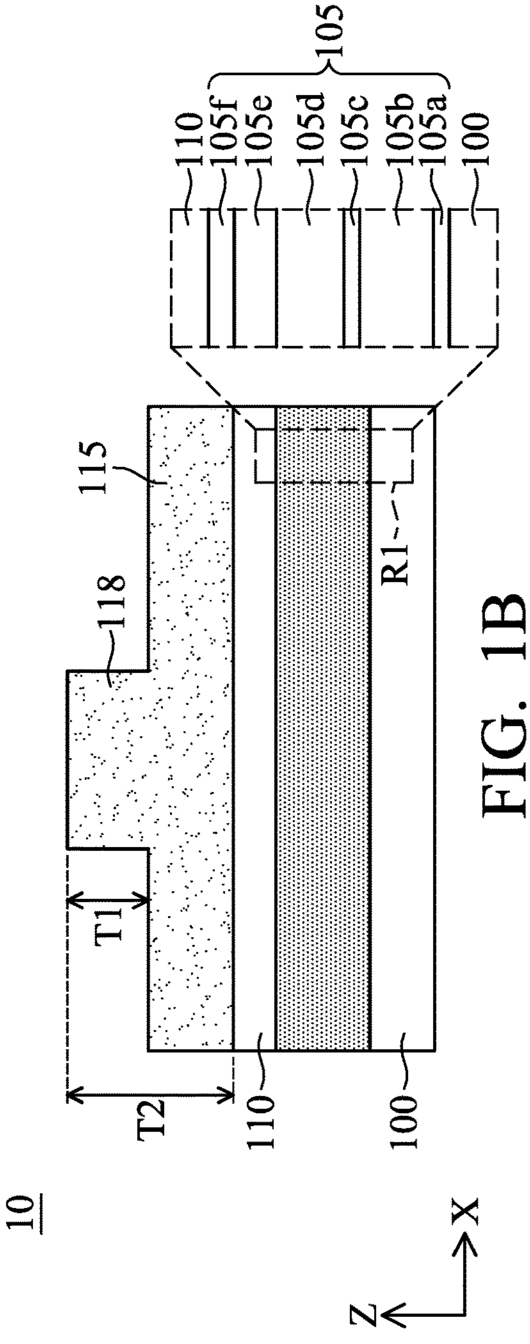
FIGS. 1B, 4A~4D, 6A~6D, 8A~8D, 11A~11D, 13A~13D, 16A~16D, 18A~18D, 21A~21D, and 23A~23D illustrate cross-sectional views at intermediate stages of manufacturing the semiconductor structure according to the embodiment of the present disclosure.

FIG. 1B illustrates a cross-sectional view of the memory device 10 corresponding to the cross-sectional line A-A of FIG. 1A, in accordance with the embodiments of the present disclosure. A substrate 100 is provided. In some embodiments, the substrate 100 may be an elemental semiconductor substrate or an alloy semiconductor substrate. In other embodiments, the substrate 100 may be a semiconductor-on-insulator (SOI) substrate. A stack layer 105, a sacrificial layer 110, and a hard mask layer 115 are sequentially formed on the substrate 100. First, a stack layer 105 is formed on the substrate 100. The stack layer 105 is a plurality of films stacked in a third direction (e.g., a coordinate axis Z direction), and the third direction intersects a first direction (e.g., a coordinate axis Y direction) and a second direction (e.g., a coordinate axis X direction). In some embodiments, the third direction is perpendicular to the first direction and perpendicular to the second direction. In some embodiments, the stack layer 105 may sequentially include, in the third direction (e.g., the coordinate axis Z direction) from bottom to top, for example, a tunnel dielectric layer 105*a*, a floating gate layer 105*b*, an inter-gate dielectric layer 105*c*, a control gate layer 105*d*, a metal layer 105*e*, and a top capping layer 105*f*. For the sake of simplicity, each of the layers mentioned above only partially shown in the region R1 in FIG. 1B, and only the stack layer 105 is shown schematically in the following figures. In some embodiments, the material of the tunnel dielectric layer 105*a* may be silicon oxide. In some embodiments, the material of the floating gate layer 105*b* may be a conductive material, such as doped polysilicon, undoped polysilicon, or a combination thereof. In some embodiments, the inter-gate dielectric layer 105*c* may be a composite layer constructed by, for example, oxide/nitride/oxide (ONO), but the present disclosure is not limited to it, and the composite layer may also be films of five or more layers. In some embodiments, the material of the control gate layer 105*d* may be a conductive material, such as doped polysilicon, undoped polysilicon, or a combination thereof. In some embodiments, the material of the metal layer 105*e* may be such as W, TiN, or a combination thereof. In some embodiments, the material of the top capping layer 105*f* may be a dielectric material, such as silicon nitride, silicon oxynitride, or a combination thereof.

Next, the sacrificial layer 110 is formed on the stack layer 105. The sacrificial layer 110 may protect the stack layer 105 from the etching process during subsequent process steps of patterning the hard mask layer 115. In some embodiments, the material of the sacrificial layer 110 includes silicon oxide. The hard mask layer 115 is formed on the sacrificial layer 110. The hard mask layer 115 may be used as a patterned mask for the stack layer 105 in subsequent process steps. The hard mask layer 115 has a protrusion 118, the protrusion 118 extending in the first direction (e.g., the coordinate axis Y direction). In the embodiment of the present disclosure, by forming the hard mask layer 115 with the protrusion 118, thereby enabling the subsequent dummy structure 200 to be formed as a solid block, which is described in more detail hereinafter. The step of forming the hard mask layer 115 includes partially patterning the material layers (not shown separately) of the hard mask layer 115, thereby forming the hard mask layer 115 with the protrusion 118. In some embodiments, the hard mask layer 115 may be a single-layer or multi-layer structure. In some embodiments, the material of the hard mask layer 115 includes polycrystalline silicon. In some embodiments, referring to FIG. 1A, the width W1 of the protrusion 118 in the second direction ranges from about 210 nm to about 230 nm. In some embodiments, referring to FIG. 1B, the thickness T1 of the protrusion 118 ranges from about 120 nm to about 130 nm, and the ratio of the thickness T1 of the protrusion 118 to the thickness T2 of the hard mask layer 115 is 0.6:1 to 0.5:1.

Figure 2:
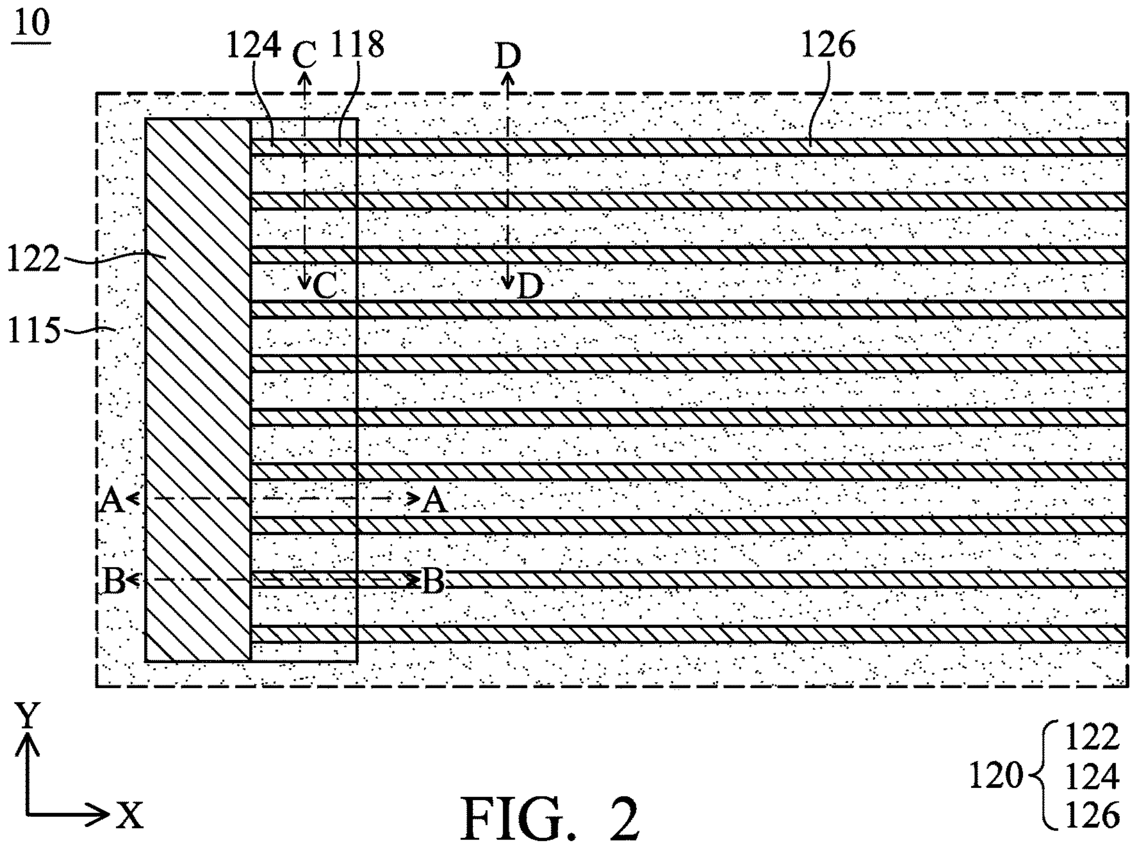
Figure 3:
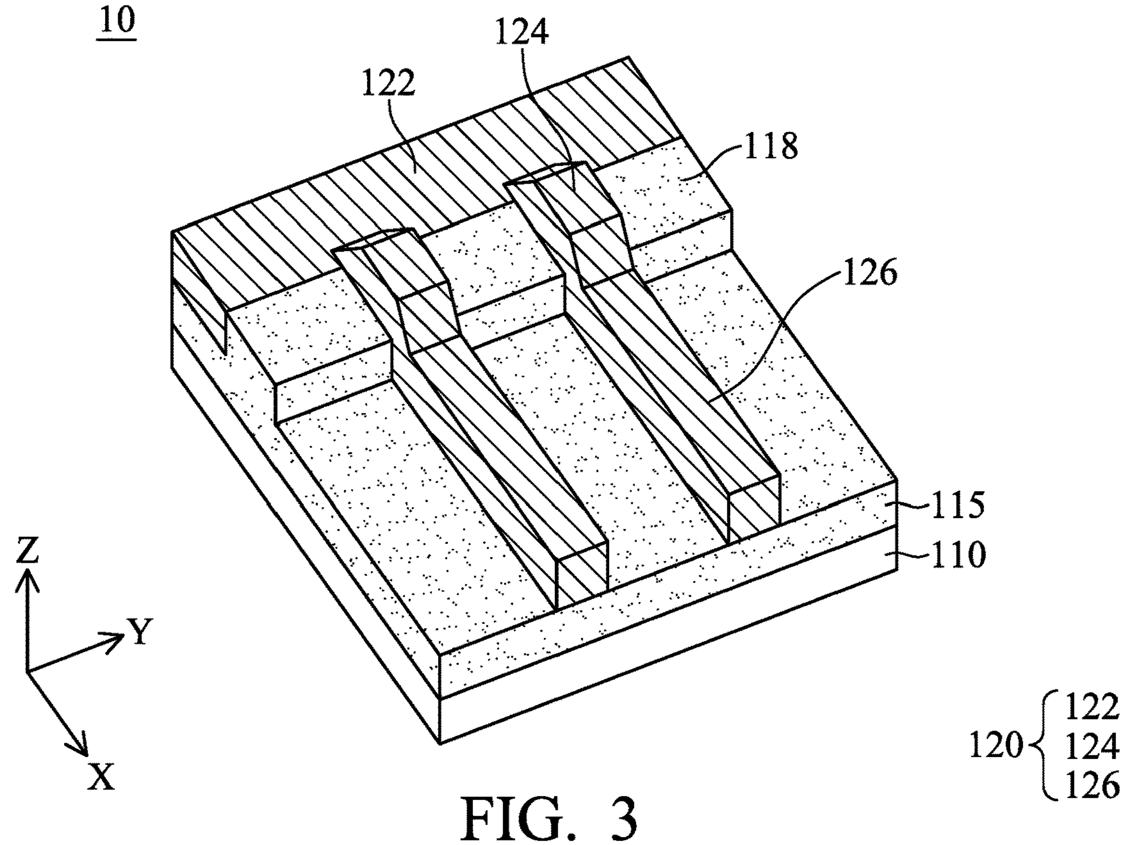
FIGS. 3, 10, 15, and 20 illustrate partial perspective views at intermediate stages of manufacturing the semiconductor structure according to the embodiment of the present disclosure.
Figures 4A, 4B, 4C, 4D:
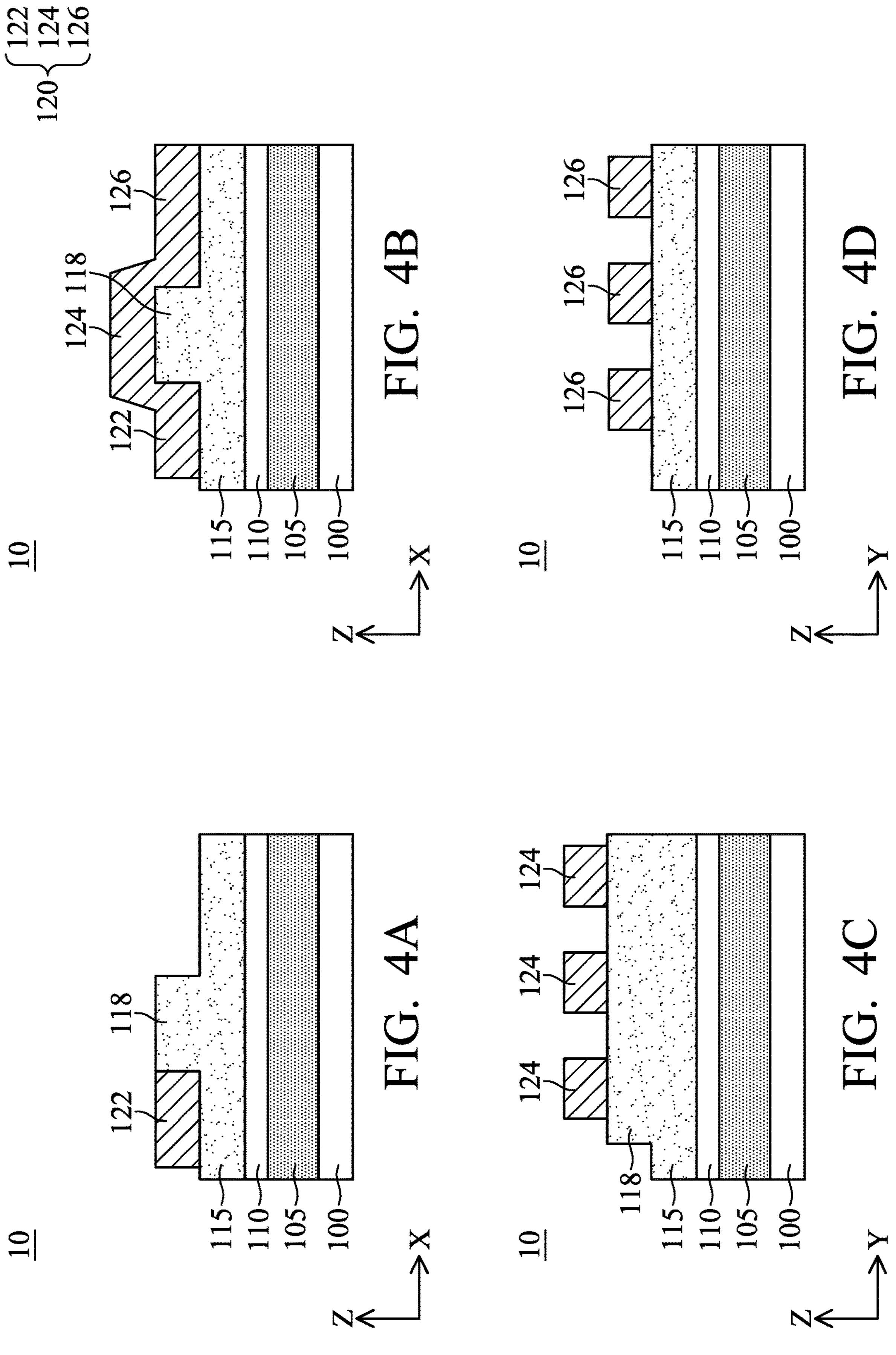

Referring next to FIG. 2 and in conjunction with FIGS. 3 and 4A~4D, the steps for forming the patterned mandrel 120 are illustrated. FIGS. 4A, 4B, 4C, and 4D illustrate cross-sectional views of the memory device 10 corresponding to cross-sectional line A-A, cross-sectional line B-B, cross-sectional line C-C, and cross-sectional line D-D of FIG. 2, respectively, in accordance with the embodiments of the present disclosure. The patterned mandrel 120 is formed on the hard mask layer 115. As illustrated in FIGS. 2 and 3, the patterned mandrel 120 includes a first mandrel 122 which extends in the first direction (e.g., the coordinate axis Y direction) and is disposed adjacent to the projection 118 (as illustrated in FIG. 4A). The patterned mandrel 120 includes a second mandrel 124 which is disposed on the top surface of the protrusion 118 (as illustrated in FIG. 4B). The patterned mandrel 120 includes a third mandrel 126 which extends in the second direction (e.g., the coordinate axis X direction). The first and second directions intersect. In some embodiments, the patterning mandrel 120 is used to perform a self-aligned double patterning (SADP) process, but it should be understood that in other embodiments, the patterning mandrel 120 may also be used to perform a self-aligned quadruple patterning (SAQP) process.

The patterned mandrel 120 is formed by first forming a mandrel layer (not shown separately) on the hard mask layer 115 and forming a photoresist pattern (not shown separately) on the mandrel layer. After the photoresist pattern is formed, a trimming process may be performed to further reduce the width of the photoresist pattern, followed by an etching process to transfer the photoresist pattern to the mandrel layer to form the patterned mandrel 120. It should be noted that due to the presence of the protrusion 118, the patterned mandrel 120 may cross the protrusion 118. More specifically, the first mandrel 122 of the patterned mandrel 120 is connected to the third mandrel 126 by the second mandrel 124. As illustrated in FIG. 4B, the top surface of the protrusion 118 is level with the top surfaces of the first mandrel 122 and the third mandrel 126 of the patterned mandrel 120. It should be noted that due to the presence of the protrusion 118, the second mandrel 124 may have tilted sidewalls in the second direction, which may allow the spacer material layer 130 subsequently formed on the tilted sidewalls to be removed after the etching process, which is described in more detail hereinafter. FIG. 4C illustrates a cross-sectional view of the second mandrel 124 disposed on the top surface of the protrusion 118, while FIG. 4D illustrates a cross-sectional view of the third mandrel 126 disposed on the hard mask layer 115. The top surface of the second mandrel 124 is higher than the top surface of the third mandrel 126. In some embodiments, the material of the patterned mandrel 120 may include carbon, silicon oxynitride (SiON), bottom anti-reflective coating (BARC), or a combination thereof. In some embodiments, referring to FIG. 4A, the ratio of the width of the protrusion 118 in the second direction to the width of the first mandrel 122 in the second direction is 1:1 to 1:1.1.

Figure 5:
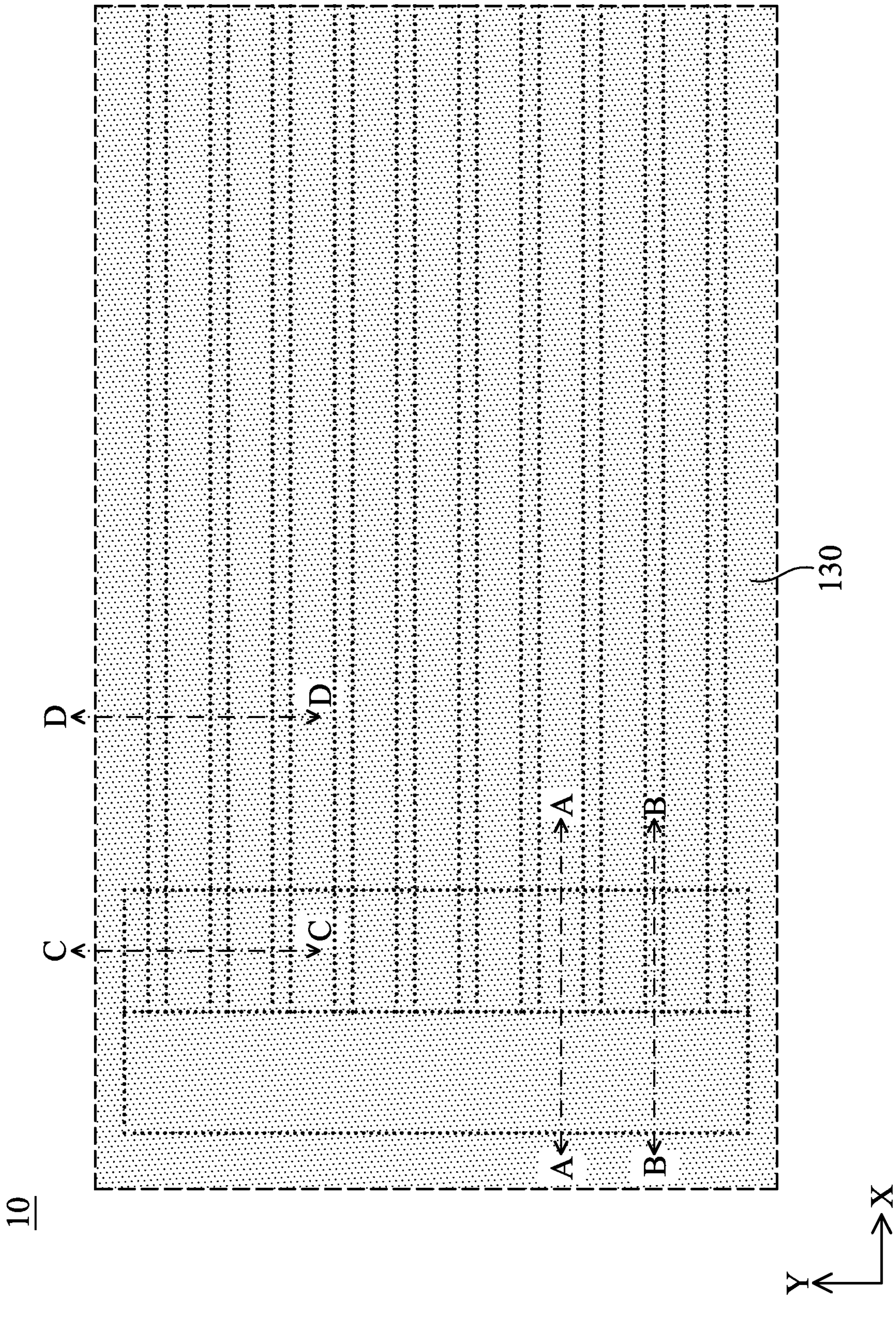
Figure 6A:
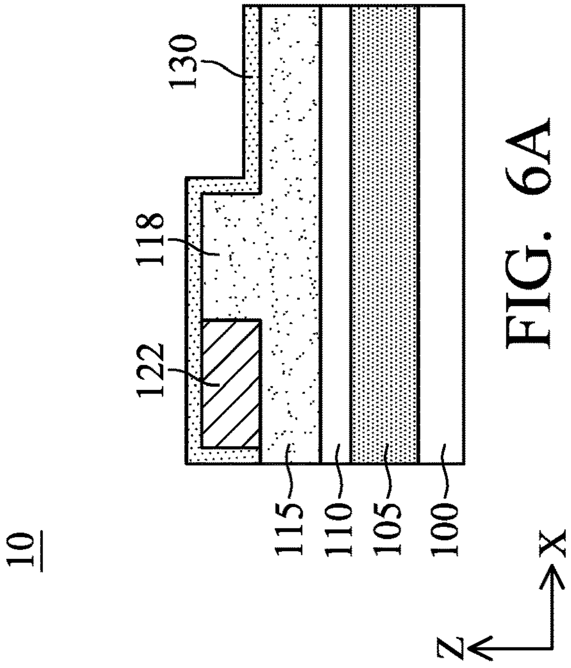
Figure 6B:
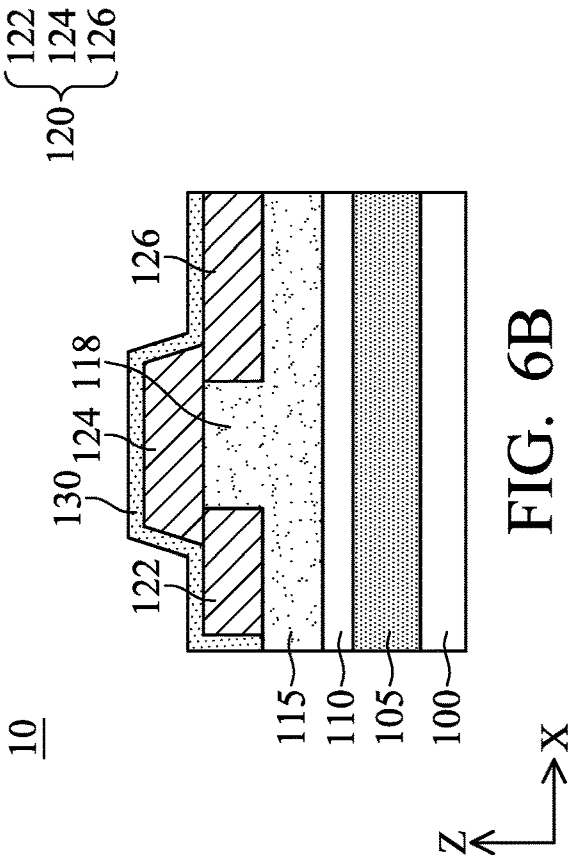
Figure 6C:
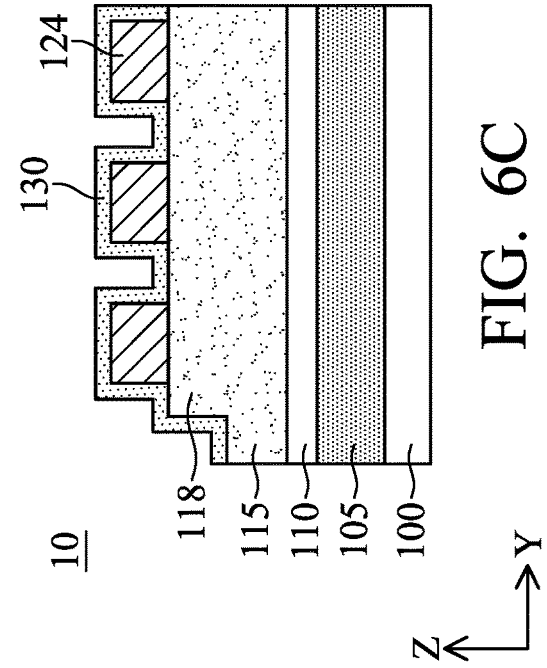
Figure 6D:
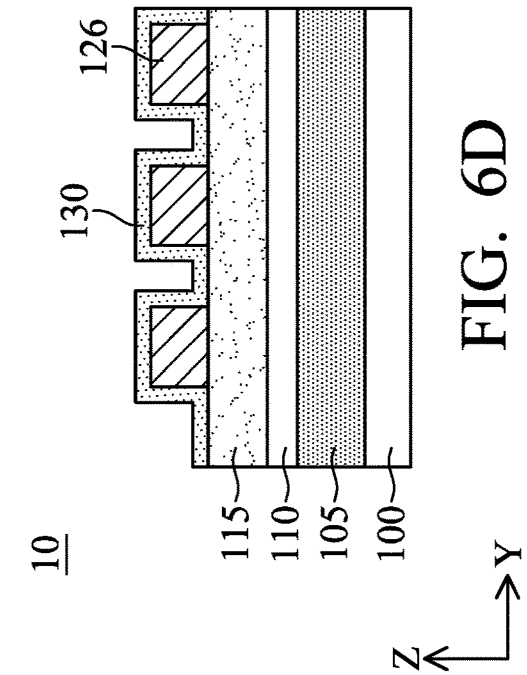

Next, refer to FIG. 5 and in conjunction with FIGS. 6A~6D. FIGS. 6A, 6B, 6C, and 6D illustrate cross-sectional views of the memory device 10 corresponding to cross-sectional line A-A, cross-sectional line B-B, cross-sectional line C-C, and cross-sectional line D-D of FIG. 5, respectively, in accordance with the embodiments of the present disclosure. After forming the patterned mandrel 120, the self-aligned double patterning process is continued to form a spacer pattern on the hard mask layer 115. First, a spacer material layer 130 is conformally formed on the hard mask layer 115 and on the patterned mandrel 120. In some embodiments, the spacer material layer 130 may be formed by, for example, chemical vapor deposition (CVD), atomic layer deposition (ALD). In some embodiments, the material of the spacer material layer 130 may be an oxide such as silicon oxide. Referring to FIG. 6A, in the second direction, since the first mandrel 122 is adjacent to the protrusion 118, the spacer material layer 130 is formed on only one of the sidewalls of the first mandrel 122. Referring to FIG. 6B, in the second direction, the spacer material layer 130 is formed on both tilted sidewalls and the top surface of the second mandrel 124. Referring to FIG. 6C, in the first direction, the spacer material layer 130 is formed on the sidewalls and the top surface of the second mandrel 124. Referring to FIG. 6D, in the first direction, the spacer material layer 130 is formed on the sidewalls and the top surface of the third mandrel 126.

Figure 7:
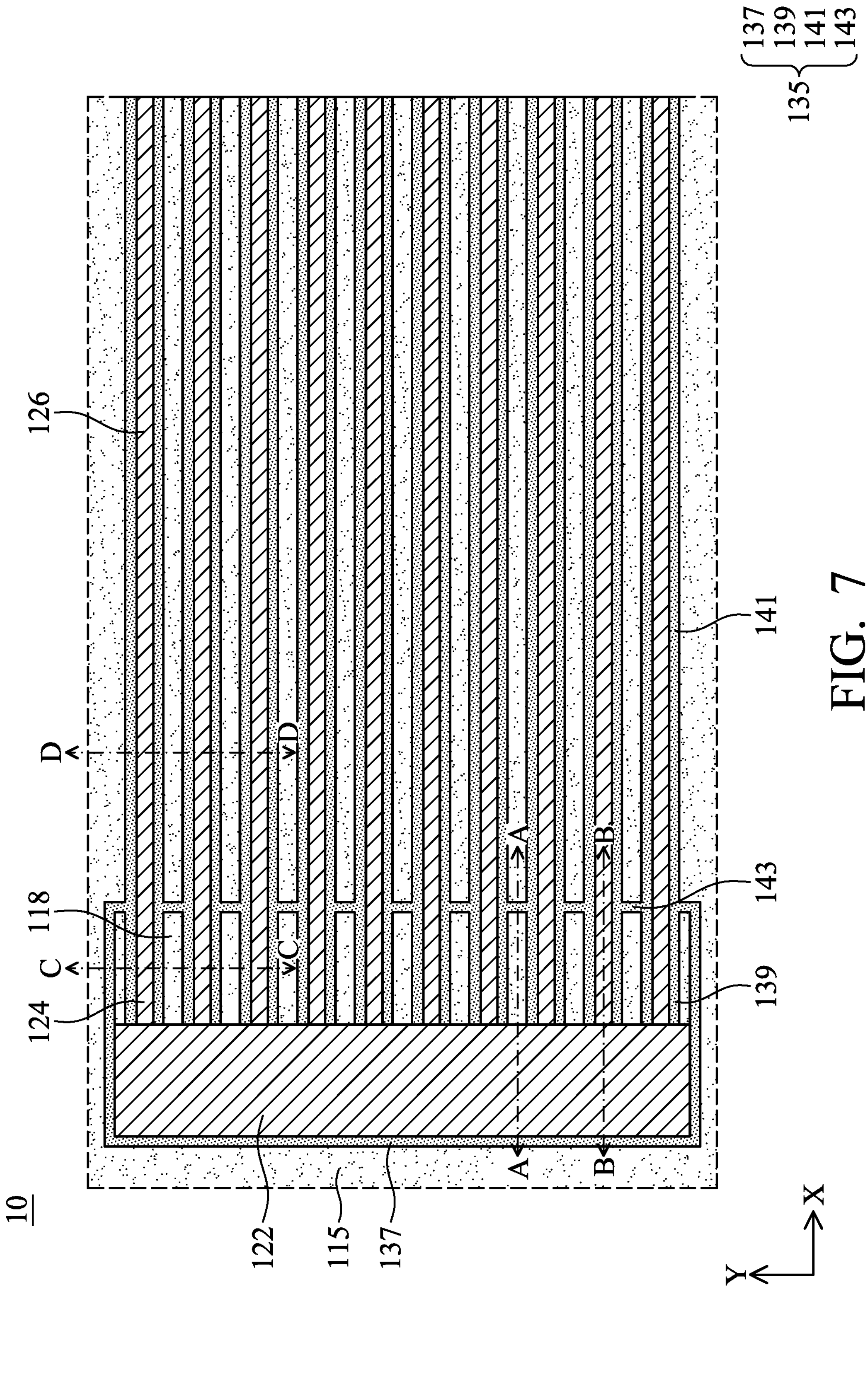
Figure 8A:
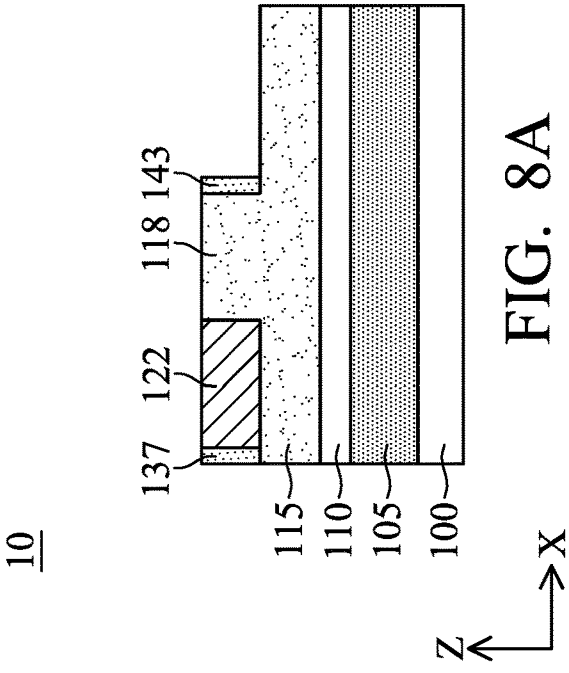
Figure 8B:
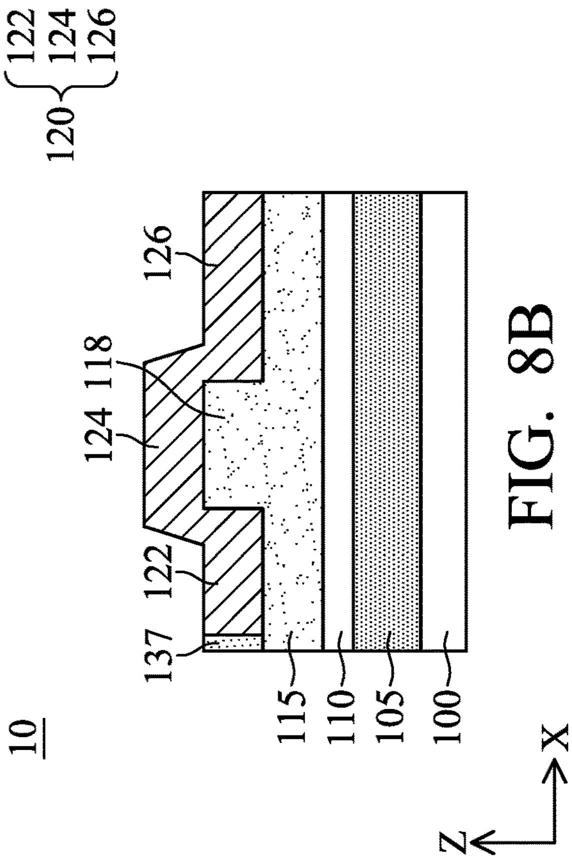
Figure 8C:
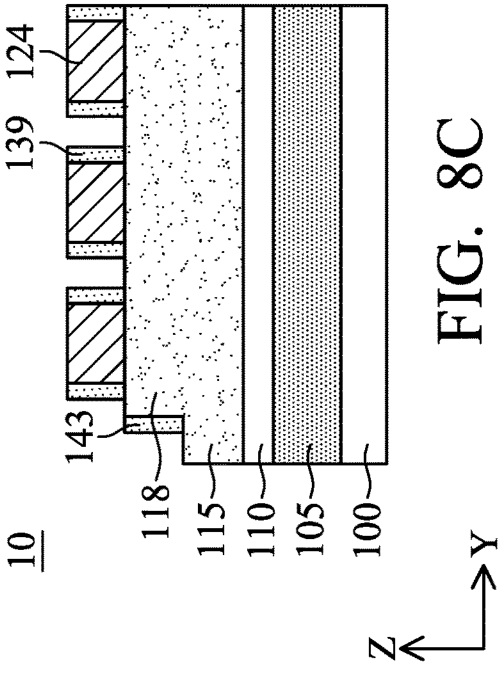
Figure 8D:
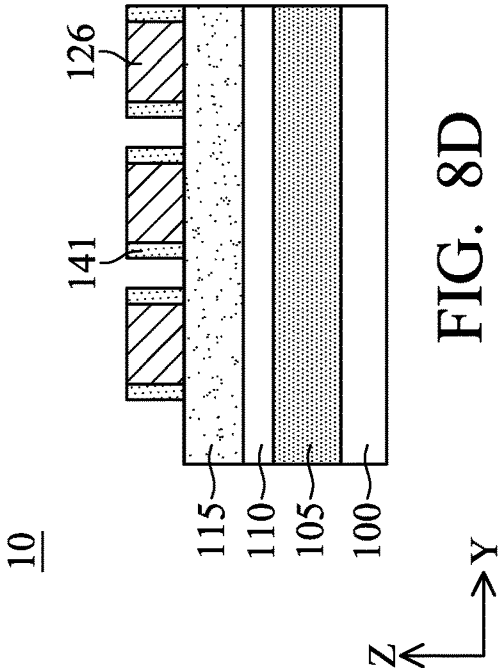

Subsequently, refer to FIG. 7 and in conjunction with FIGS. 8A~8D. FIGS. 8A, 8B, 8C, and 8D illustrate cross-sectional views of the memory device 10 corresponding to cross-sectional line A-A, cross-sectional line B-B, cross-sectional line C-C, and cross-sectional line D-D of FIG. 7, respectively, according to the embodiments of the present disclosure. After forming the spacer material layer 130, the self-aligned double patterning process further includes performing an etching back process on the spacer material layer 130 until the top surface of the patterned mandrel 120 and a portion of the top surface of the hard mask layer 115 are exposed, thereby forming a spacer pattern 135 on the sidewalls of the patterned mandrel 120. The spacer pattern 135 includes a first pattern 137, a second pattern 139, a third pattern 141, and a fourth pattern 143. The first pattern 137 is correspondingly formed on the sidewalls of the first mandrel 122. The second pattern 139 is correspondingly formed on the sidewalls of the second mandrel 124. The third pattern 141 is correspondingly formed on the sidewalls of the third mandrel 126. The fourth pattern 143 is correspondingly formed on the sidewalls of the protrusion 118. After forming the spacer pattern 135, the top surface of the third pattern 141 corresponding to the spacer pattern 135 formed on the sidewall of the third mandrel 126 is level with the top surface of the third mandrel 126. In other words, the top surface of the third pattern 141 is level with the top surface of the protrusion 118. In some embodiments, the etching process may include an anisotropic etching process, such as dry etching of reactive ion etching (RIE) process, plasma etching, or inductively coupled plasma (ICP) etching. The second pattern 139 and the third pattern 141 are connected to each other by the fourth pattern 143 of the spacer pattern 135 formed in the protrusion 118 to present an H-shaped structure in the top view, as shown in FIG. 7. In FIG. 8A, the first pattern 137 is formed on the sidewalls of the first mandrel 122, and the fourth pattern 143 is formed on the sidewalls of the protrusion 118. In FIG. 8B, the first pattern 137 is formed on the sidewalls of the first mandrel 122, and the fourth pattern 143 is not formed on the sidewalls of the protrusion 118 due to the presence of the third mandrel 126. It should be noted that in FIG. 8B, since the second mandrel 124 has a tilted sidewall in the second direction, the spacer material layer formed on the tilted sidewall is removed simultaneously during the etching process and the second pattern 139 is not formed on the tilted sidewall of the second mandrel 124. In FIG. 8C, the second pattern 139 is formed on the sidewalls of the second mandrel 124, and the fourth pattern 143 is formed on the sidewalls of the protrusion 118. In FIG. 8D, the third pattern 141 is formed on the sidewalls of the third mandrel 126.

Figure 9:
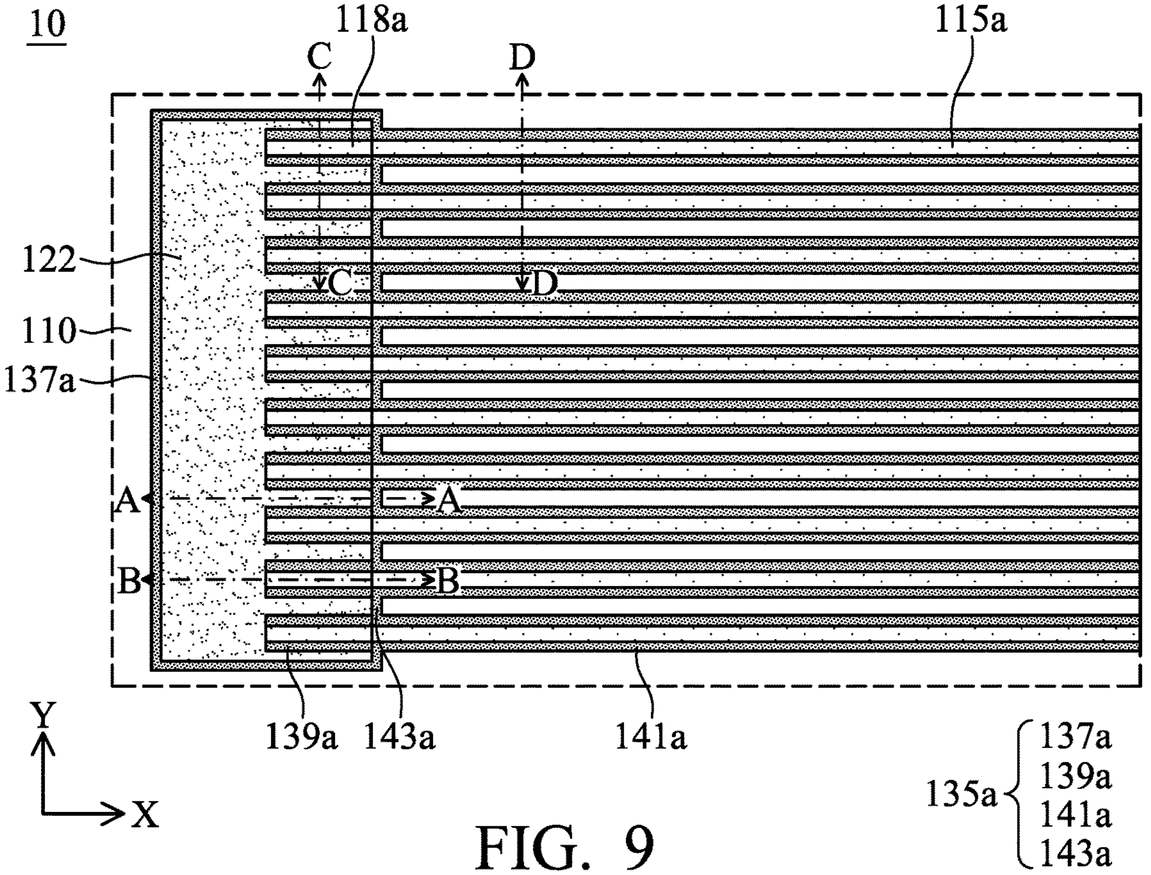
Figure 10:
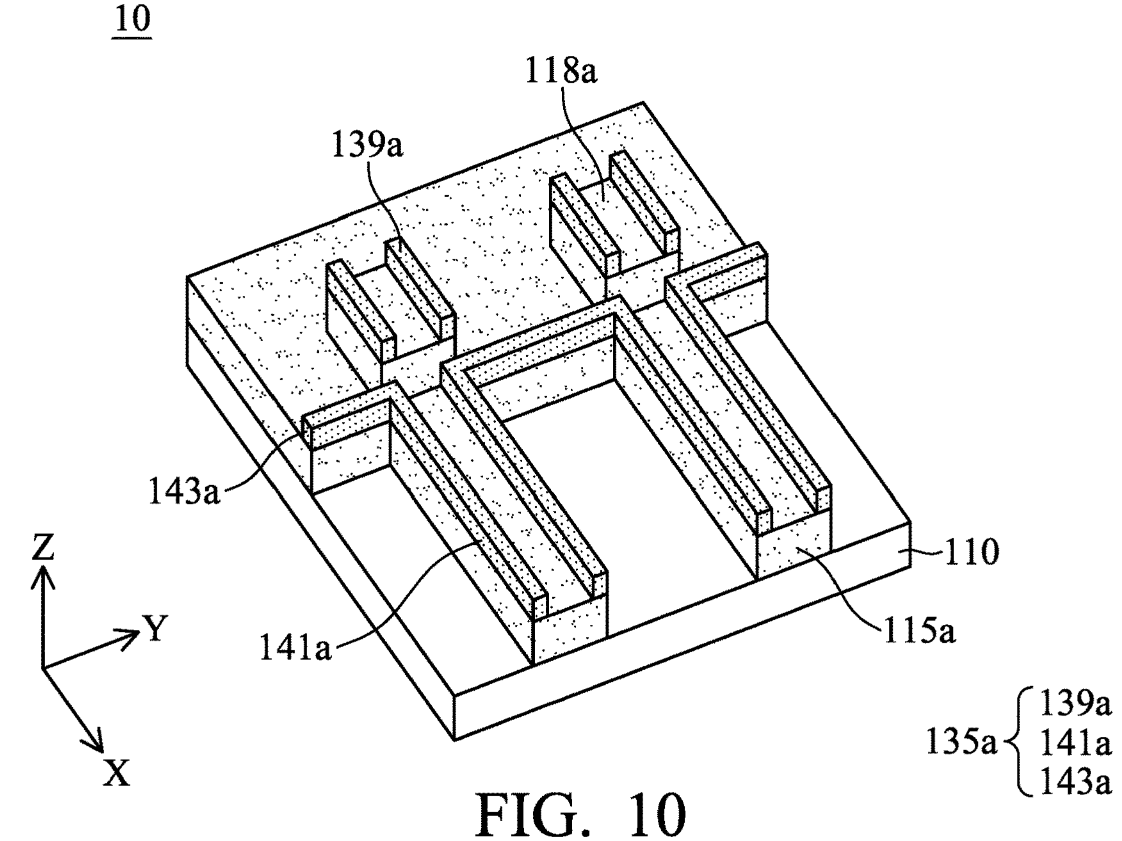
Figure 11A:
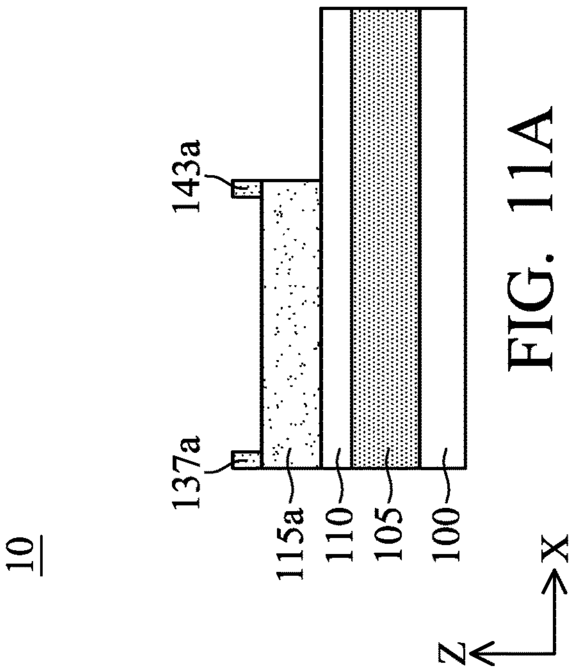
Figure 11B:
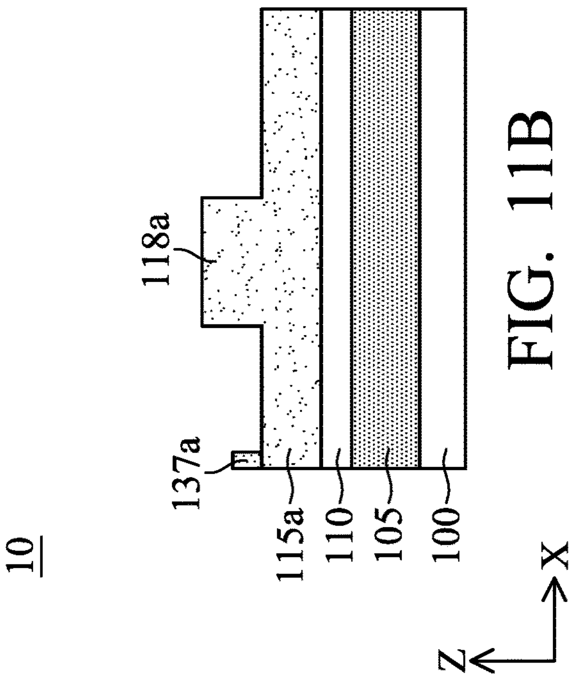
Figure 11C:
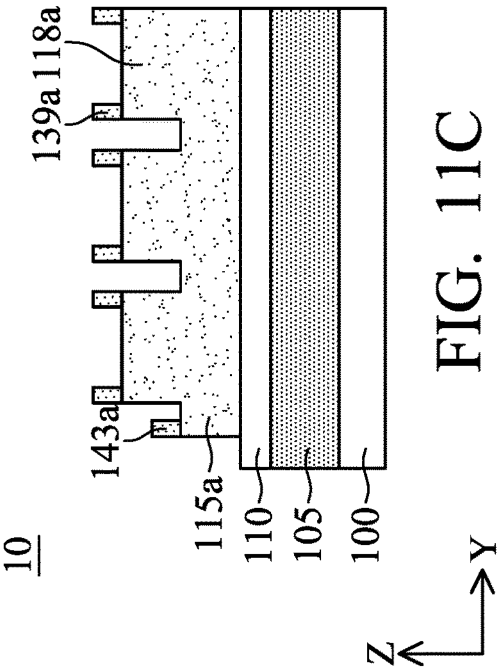
Figure 11D:
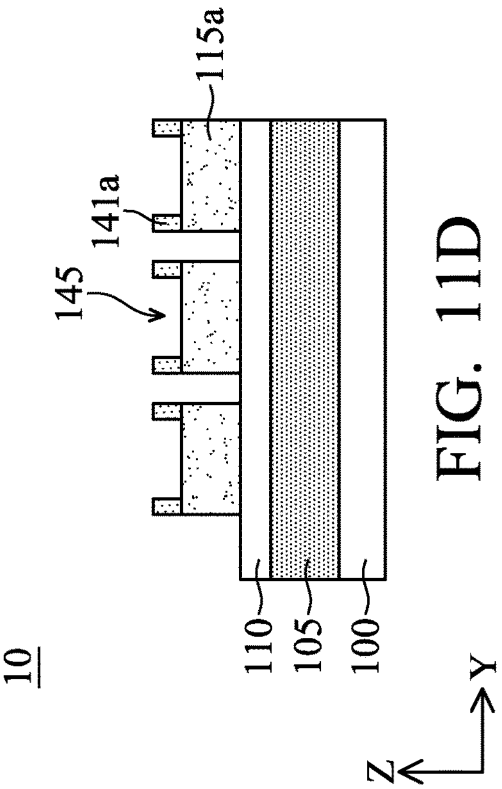

Refer to FIG. 9 and in conjunction with FIGS. 10 and 11A~11D. FIGS. 11A, 11B, 11C, and 11D illustrate cross-sectional views of the memory device 10 corresponding to the cross-sectional line A-A, cross-sectional line B-B, cross-sectional line C-C, and cross-sectional line D-D of FIG. 9, respectively, according to the embodiments of the present disclosure. After forming the spacer pattern 135, the self-aligned double patterning process further includes transferring the pattern of the patterned mandrel 120 and the spacer pattern 135 to the hard mask layer 115, thereby forming the patterned hard mask layer 115*a*. In some embodiments, during the etching process of transferring the pattern of the patterned mandrel 120 and the spacer pattern 135, the patterned mandrel 120 may be removed simultaneously to leave a portion of the spacer pattern 135*a* including a first pattern 137*a*, a second pattern 139*a*, a third pattern 141*a*, and a fourth pattern 143*a*. In some embodiments, the spacer pattern 135*a* has a height lower than the height of the spacer pattern 135 due to the effects of the etching process. In FIG. 11A, the first pattern 137*a* and the fourth pattern 143*a* are left behind, and a portion of the top surface of the hard mask layer 115*a* and a portion of the top surface of the sacrificial layer 110 are exposed. In FIG. 11B, the first pattern 137*a* is left behind, and a portion of the top surface of the hard mask layer 115*a* is exposed, and a sidewall and the top surface of the sub-protrusion 118*a* are further exposed. In FIG. 11C, the second pattern 139*a* and the fourth pattern 143*a* are left behind, a portion of the top surface of the sacrificial layer 110 and a portion of the top surface of the hard mask layer 115*a* are exposed, and a portion of the top surface of the sub-protrusion 118*a* is further exposed. In FIG. 11D, the third pattern 141*a* is left behind, and a portion of the top surface of the sacrificial layer 110 and a portion of the top surface of the hard mask layer 115*a* are exposed. In FIG. 11D, the third pattern 141*a* forms a recessed region 145 over the hard mask layer 115*a* and exposing a portion of the top surface of the hard mask layer 115*a*.

Referring to FIG. 10 and FIG. 11B, the step of transferring the pattern of the patterned mandrel 120 and the spacer pattern 135 to the hard mask layer 115 includes removing a portion of the protrusion 118 that is exposed by the patterned mandrel 120 and the spacer pattern 135 to leave the sub-protrusion 118*a*. One of the sidewalls of the sub-protrusion 118*a* in the second direction (e.g., the coordinate axis X direction) is aligned with the sidewalls of the subsequently correspondingly formed dummy structure 200 in the second direction, which is described in more detail hereinafter. After leaving the spacer pattern 135*a* on the hard mask layer 115*a*, the top surface of the third pattern 141*a* corresponding to the spacer pattern 135*a* formed on the third mandrel 126 is lower than the top surface of the original protrusion 118, i.e., lower than the top surface of the sub-protrusion 118*a*.

Figure 12:
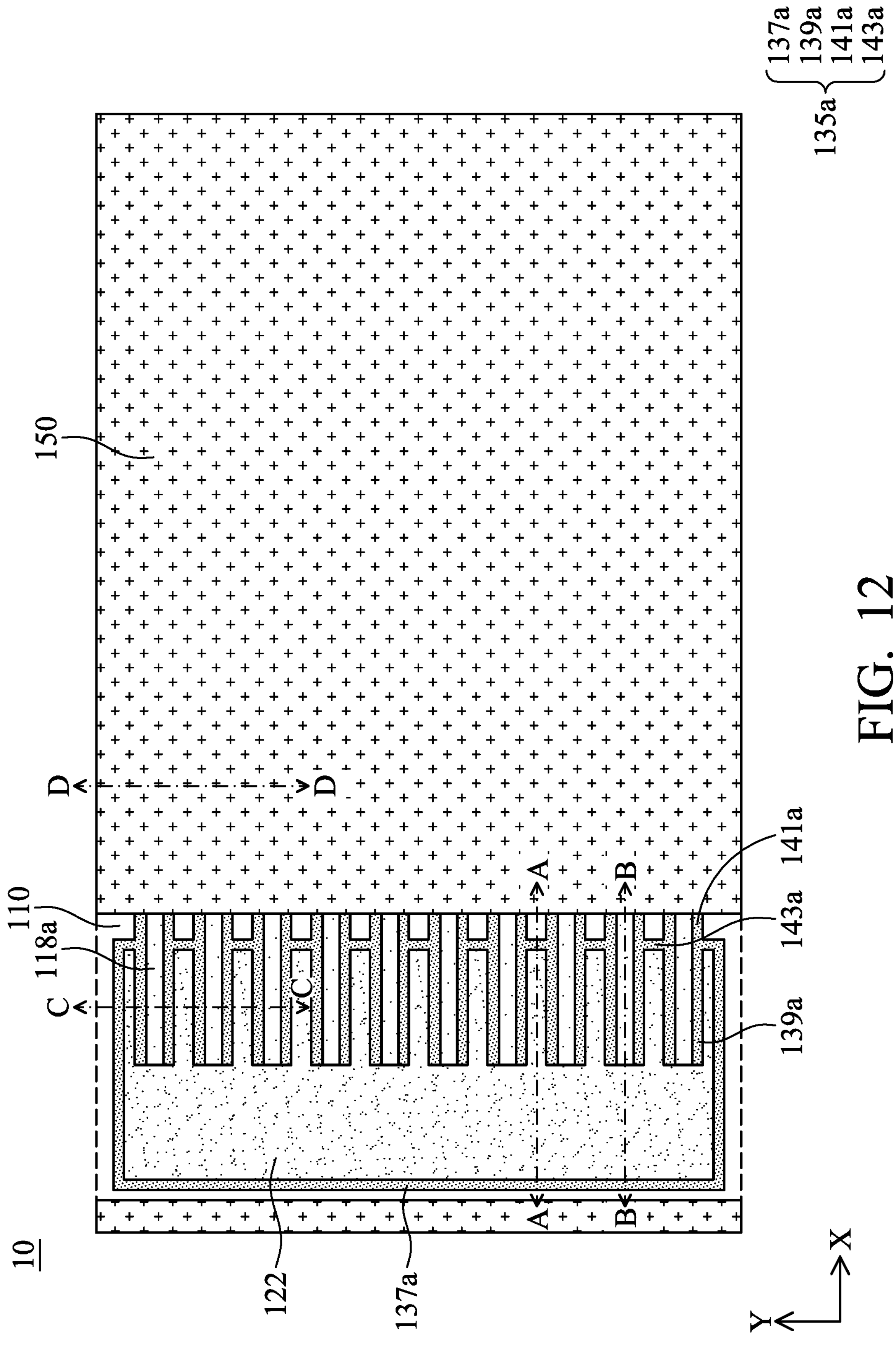
Figure 13A:
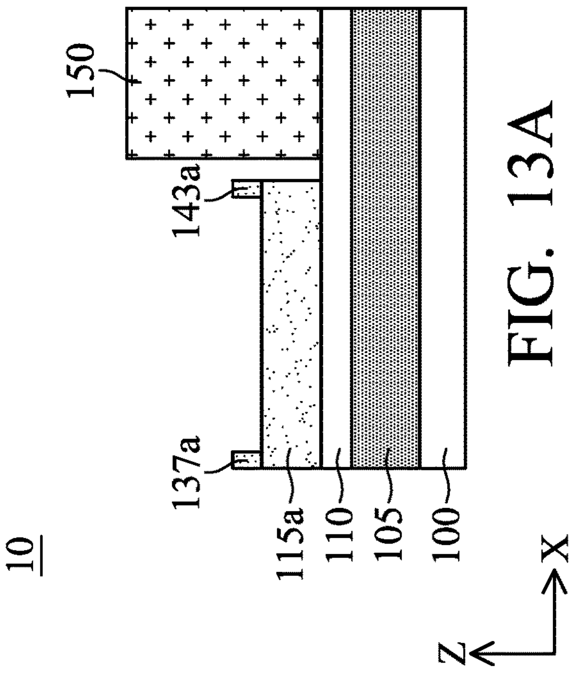
Figure 13B:
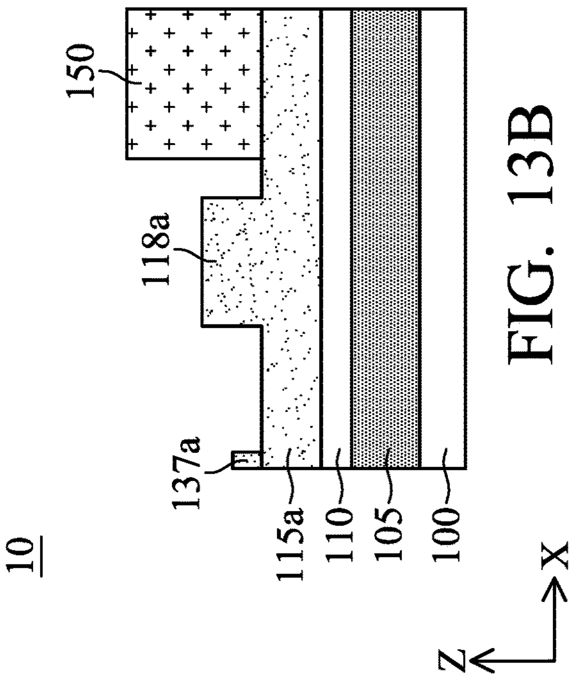
Figure 13C:
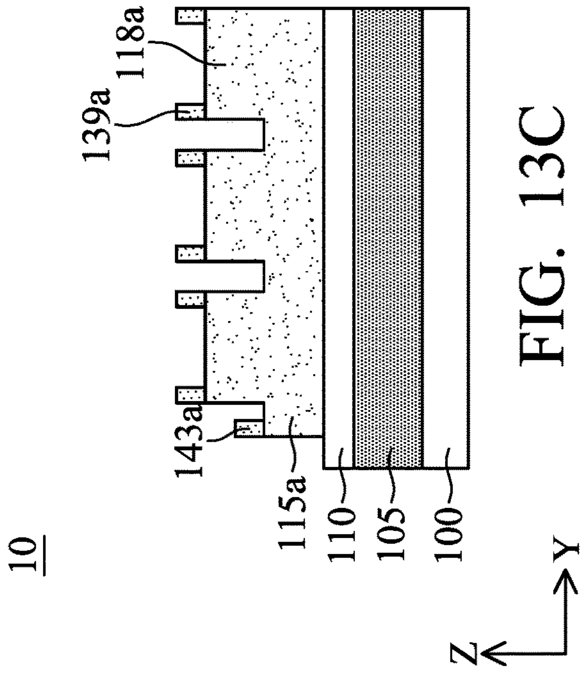
Figure 13D:
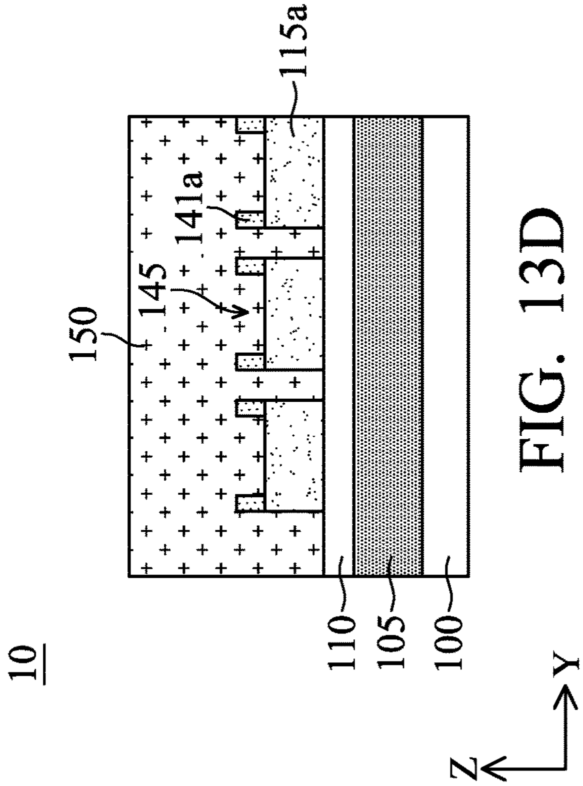

Next, refer to FIG. 12 and in conjunction with FIGS. 13A~13D. FIGS. 13A, 13B, 13C, and 13D illustrate cross-sectional views of the memory device 10 corresponding to the cross-sectional line A-A, cross-sectional line B-B, cross-sectional line C-C, and cross-sectional line D-D of FIG. 12, respectively, according to the embodiments of the present disclosure. A cutting process of the spacer pattern 135*a* is performed to form the spacer pattern 135*b* separated from each other (refer to FIG. 14). More specifically, the first pattern 137*a* and the second pattern 139*a* corresponding to the spacer pattern 135*a* formed on the sidewalls of the first mandrel 122 and the second mandrel 124 are removed, and the fourth pattern 143*a* corresponding to the spacer pattern 135*a* formed on the sidewalls of the protrusion 118 is removed, to leave a third pattern 141*a* separate from each other correspondingly formed on the sidewalls of the third mandrel 126. In other words, the cutting process is performed such that the spacer pattern 135*b* includes only the third pattern 141*a* separated from each other. The cutting process includes forming a first patterned photoresist 150 to cover a portion of the third pattern 141*a* of the spacer pattern 135*a*, and exposing a portion of an end of the third pattern 141*a* in the second direction (e.g., the coordinate axis X direction) connected by the fourth pattern 143*a*. More specifically, the first patterned resist 150 exposes the first pattern 137*a*, the second pattern 139*a*, the fourth pattern 143*a*, and a portion of the third pattern 141*a*. In FIG. 13A, the first patterned resist 150 covers the sacrificial layer 110 and exposes the hard mask layer 115*a*, the first pattern 137*a*, and the fourth pattern 143*a*. In FIG. 13B, the first patterned resist 150 covers a portion of the hard mask layer 115*a* and exposes the first pattern 137*a* and the sub-protrusion 118*a*. In FIG. 13C, the first patterned photoresist 150 does not cover the sub-projections 118*a*, the second pattern 139*a*, and the fourth pattern 143*a*. In FIG. 13D, the first patterned photoresist 150 covers the hard mask layer 115*a* and the third pattern 141*a*, and completely fills the recessed region 145.

Figure 14:
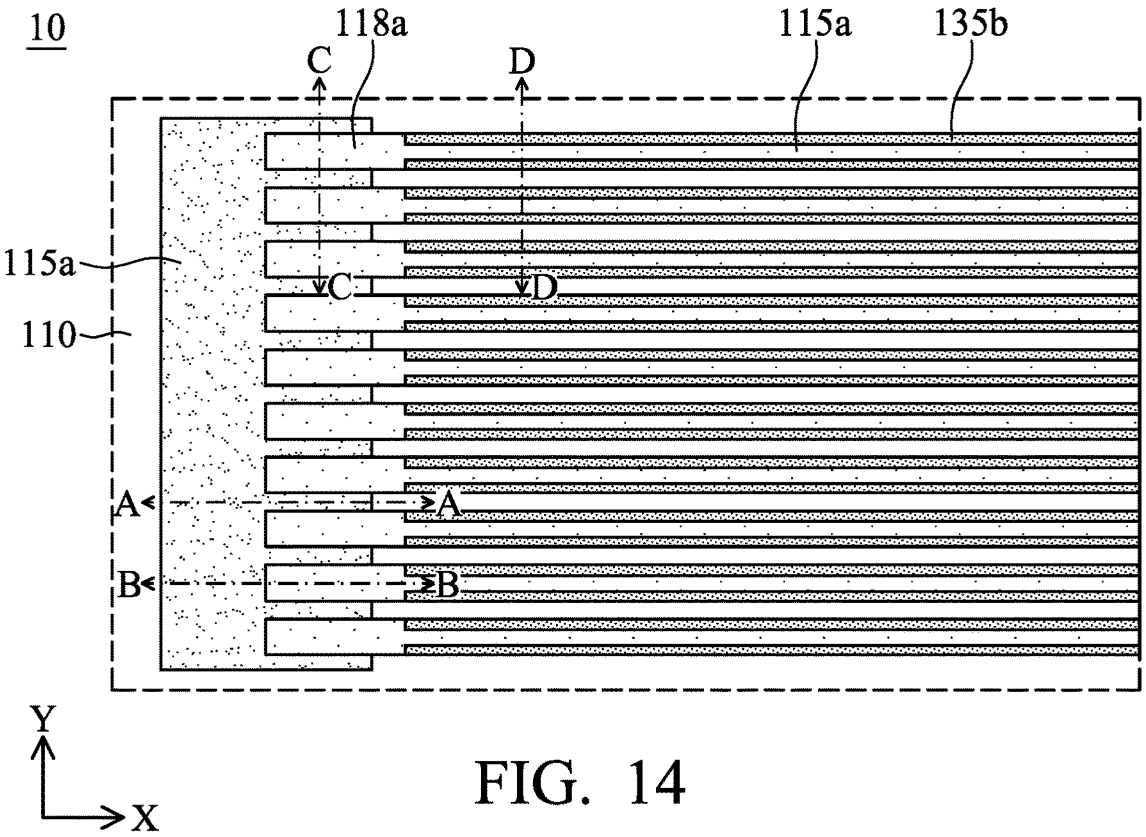
Figure 15:
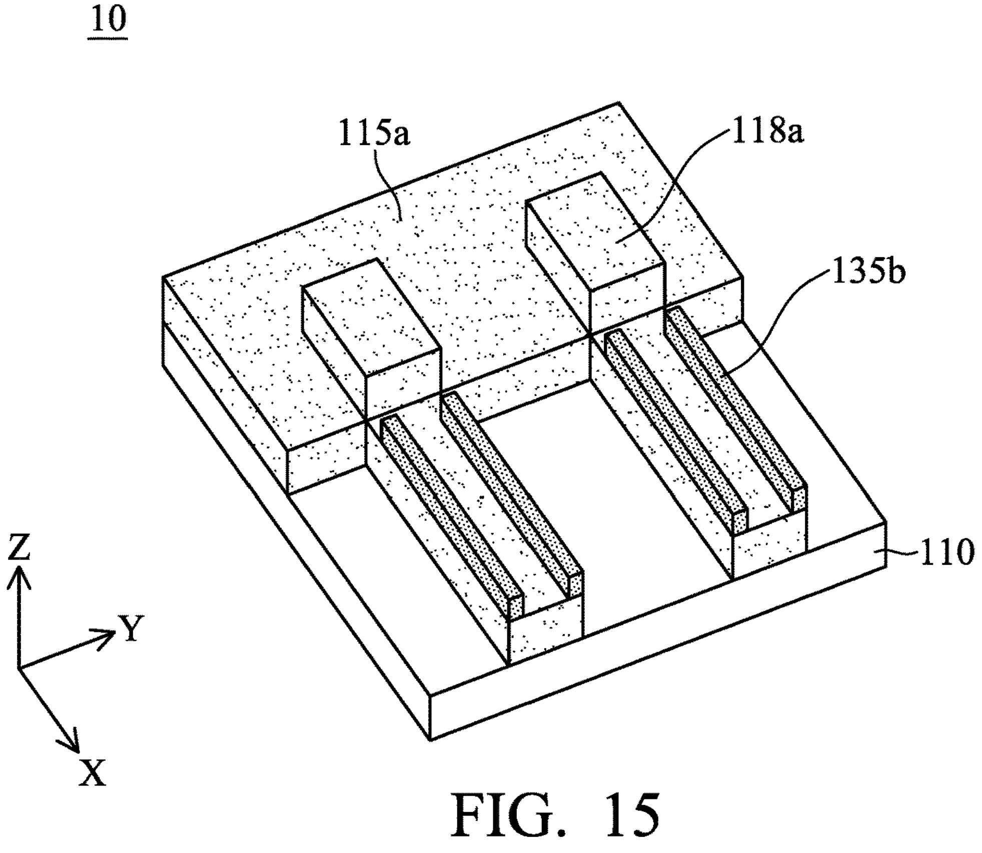
Figure 16A:
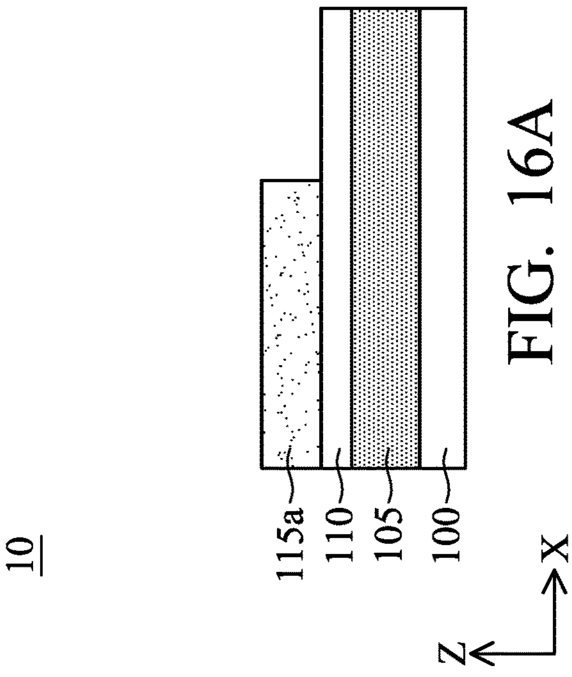
Figure 16B:
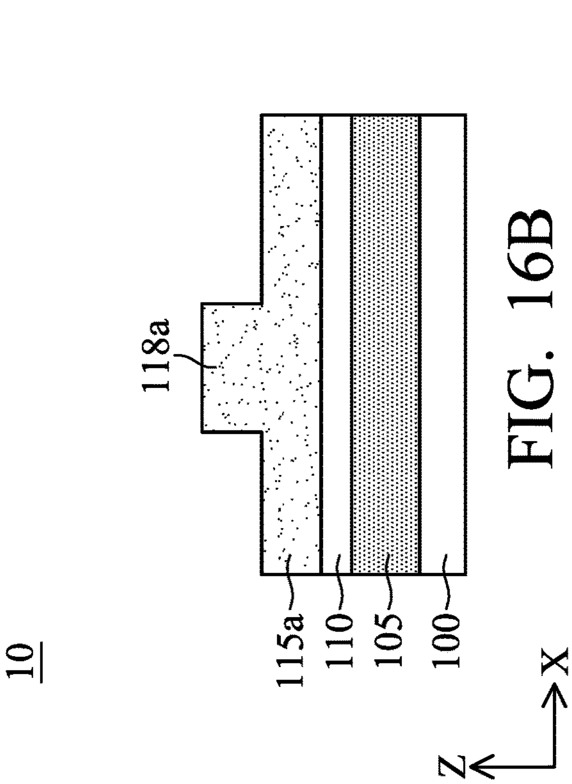
Figure 16C:
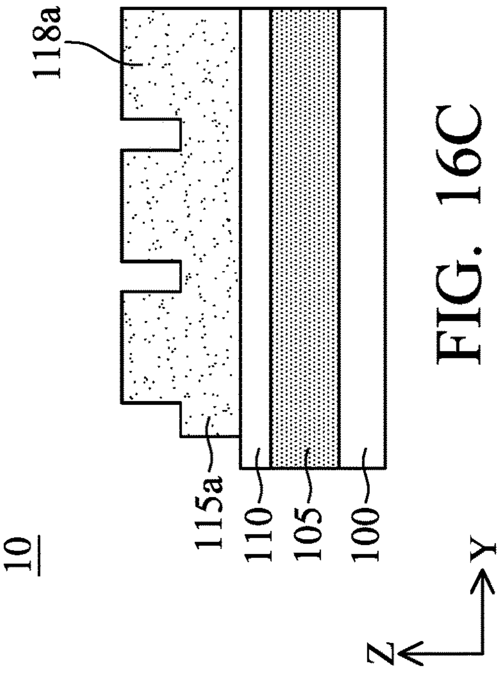
Figure 16D:
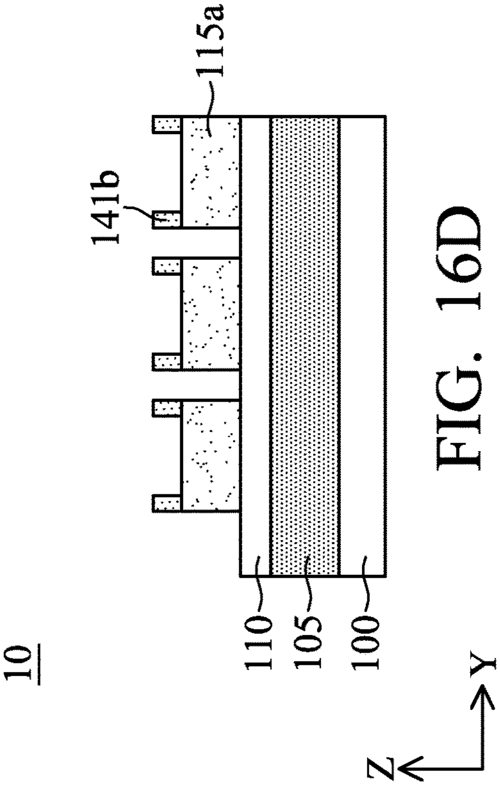

Subsequently, refer to FIG. 14 and in conjunction with FIGS. 15 and 16A~16D. FIGS. 16A, 16B, 16C, and 16D illustrate cross-sectional views of the memory device 10 corresponding to the cross-sectional line A-A, cross-sectional line B-B, cross-sectional line C-C, and cross-sectional line D-D of FIG. 14, respectively, according to the embodiments of the present disclosure. The cutting process removes multiple portions of the spacer pattern 135*a*, including removing the first pattern 137*a*, the second pattern 139*a*, a portion of the third pattern 141*a*, and the fourth pattern 143*a*. Further, the cutting process re-exposing the hard mask layer 115*a* and the sub-protrusion 118*a* that were originally covered by the first pattern 137*a*, the second pattern 139*a*, and the fourth pattern 143*a*. After the cutting process is performed, a spacer pattern 135*b* is formed without interconnecting each other. The spacer pattern 135*b* includes a plurality of third patterns 141*b* extend along the second direction (e.g., the coordinate axis X direction) and are arranged along the first direction (e.g., the coordinate axis Y direction). The portion of the stacked layer 105 corresponding to the first mandrel 122 and the second mandrel 124 (e.g., the portion corresponding to the first pattern 137*a*, the second pattern 139*a*, and the fourth pattern 143*a*) forms the dummy structure 200, which is described in more detail hereinafter. Further, the portion of the stacked layer 105 corresponding to the third mandrel 126 (e.g., the portion corresponding to the third patterns 141*b*) forms the word line structure 300, which is described in more detail hereinafter.

Figure 17:
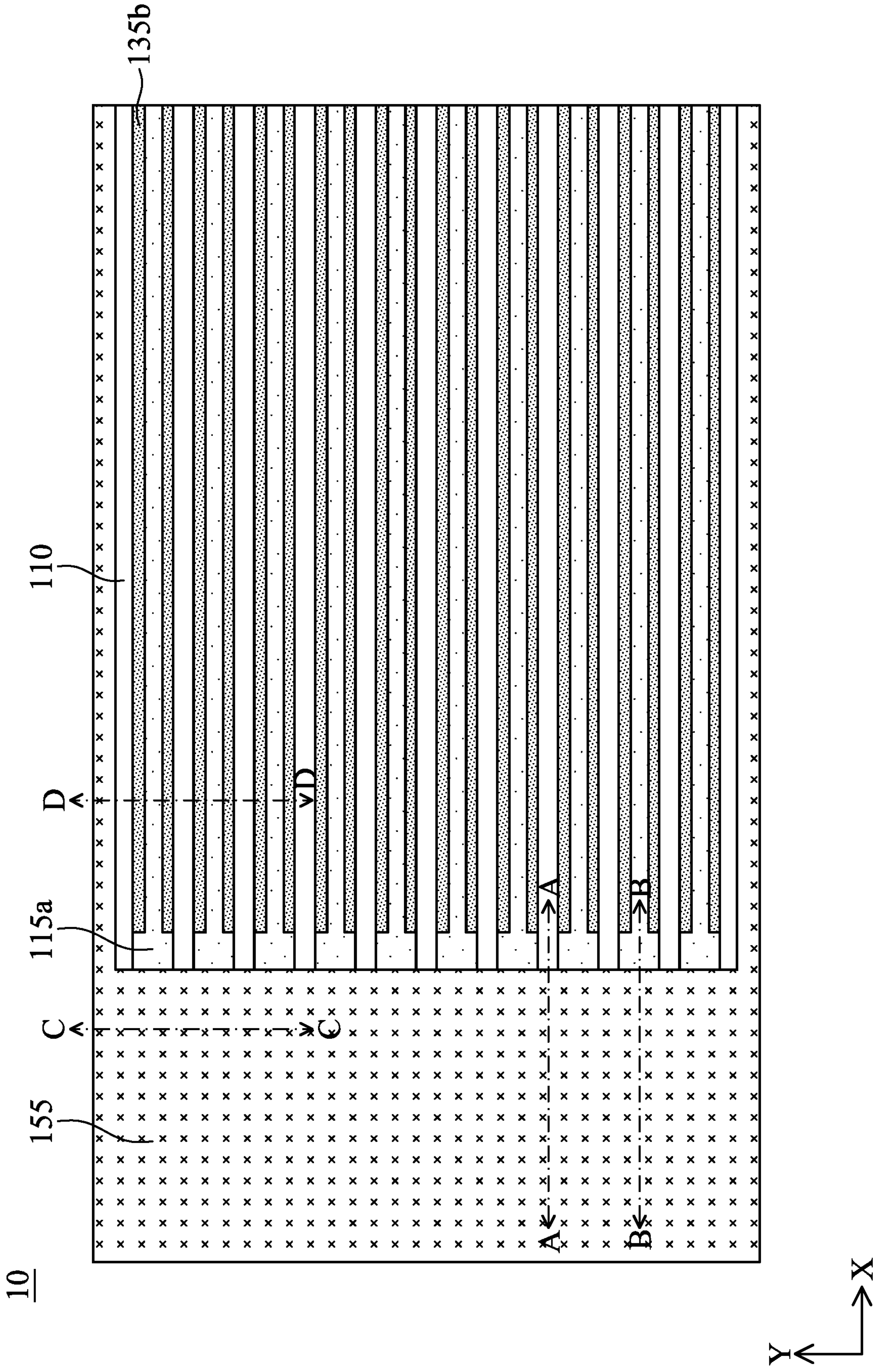
Figure 18A:
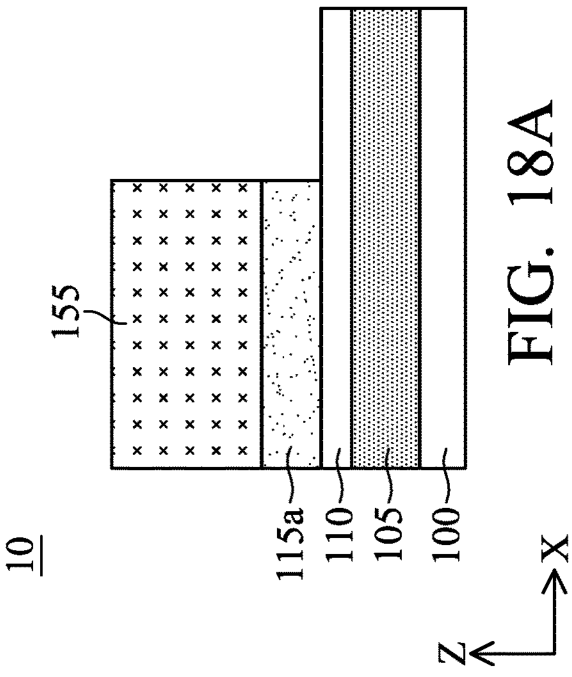
Figure 18B:
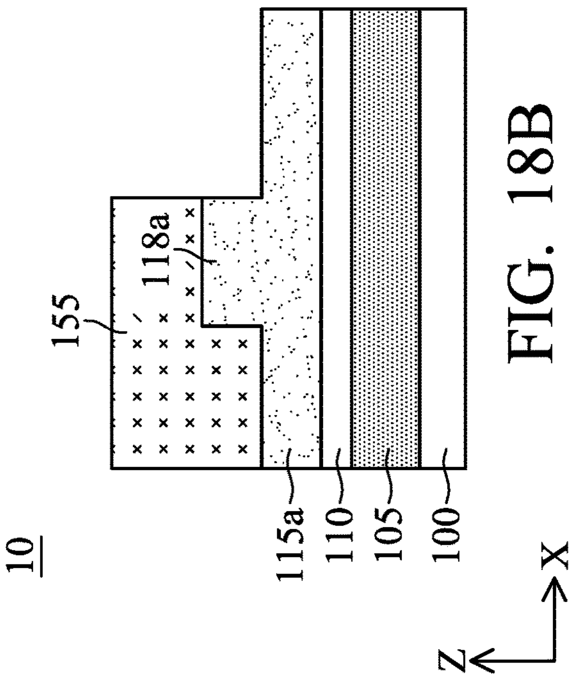
Figure 18C:
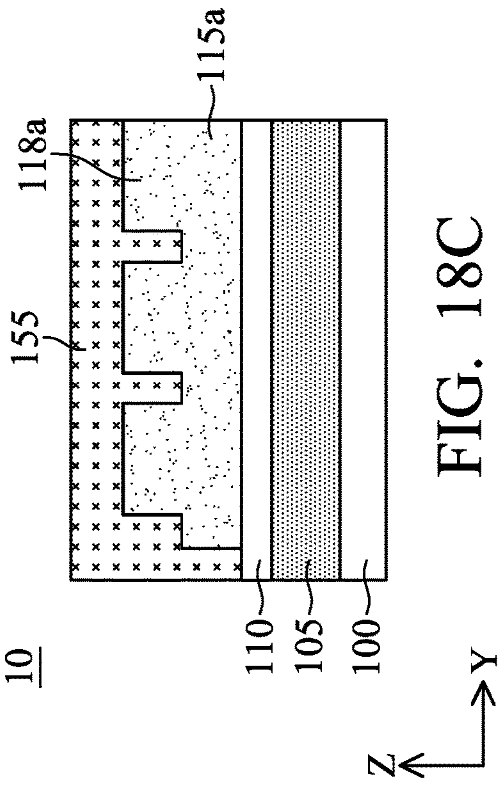
Figure 18D:
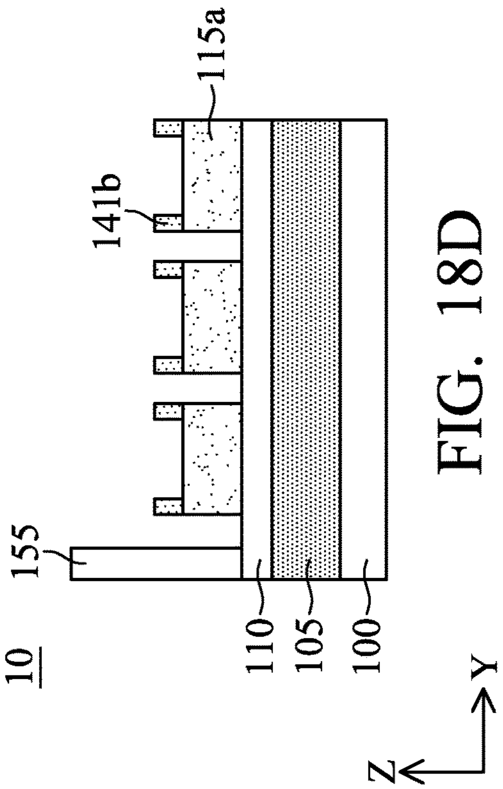

Subsequently, refer to FIG. 17 and in conjunction with FIGS. 18A~18D. FIGS. 18A, 18B, 18C, and 18D illustrate cross-sectional views of the memory device 10 corresponding to the cross-sectional line A-A, cross-sectional line B-B, cross-sectional line C-C, and cross-sectional line D-D of FIG. 17, respectively, according to the embodiments of the present disclosure. The second patterned photoresist 155 is formed to cover all portions of the hard mask layer 115*a* corresponding to the first pattern 137*a*, the second pattern 139*a*, and the fourth pattern 143*a*, and to expose the portion of the hard mask layer 115*a* corresponding to the spacer pattern 135*b* (i.e., the third patterns 141*b*). As illustrated in FIG. 17, the second patterned photoresist 155 completely covers the sub-protrusion 118*a* and exposes the spacer pattern 135*b*. In FIG. 18A, the second patterned photoresist 155 covers the hard mask layer 115*a* and exposes the sacrificial layer 110. In FIG. 18B, the second patterned photoresist 155 covers a portion of the hard mask layer 115*a*, and the second patterned photoresist 155 exposes a portion of the hard mask layer 115*a* corresponding to the third mandrel 126. In FIG. 18C, the second patterned photoresist 155 covers the hard mask layer 115*a* and the sub-protrusion 118*a*. In FIG. 18D, the second patterned photoresist 155 exposes the third patterns 141*b* separated from each other by the cutting process. In some embodiments, the distance separating the end of the third patterns 141*b* in the second direction from the second patterned photoresist 155 is equal to the distance separating the subsequently formed dummy structure 200 from the word line structure 300. In some embodiments, one of the sidewalls of the opening of the second patterned photoresist 155 in the second direction is aligned with one of the sidewalls of the sub-protrusion 118*a* in the second direction, as illustrated in FIG. 18B. In other words, one of the sidewalls of the sub-protrusion 118*a* may be aligned with one of the sidewalls of the subsequently formed dummy structure 200.

Figure 19:
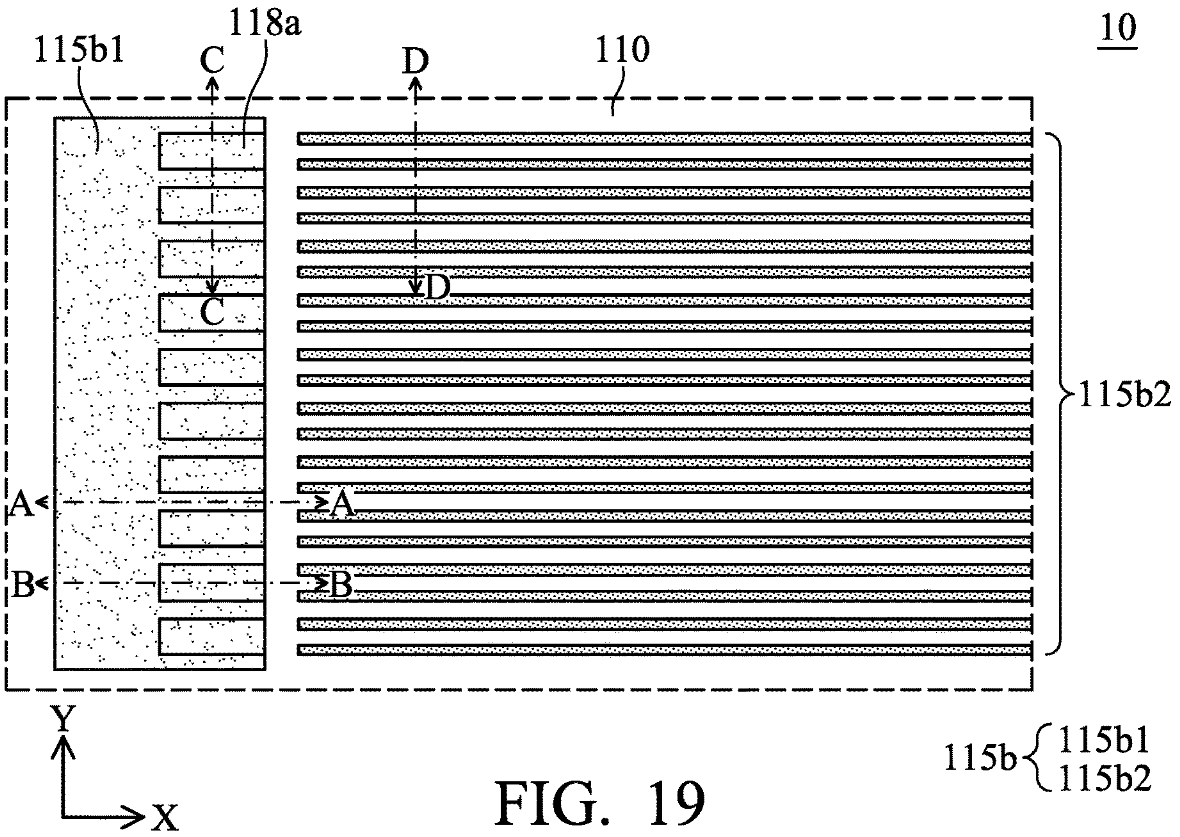
Figure 20:
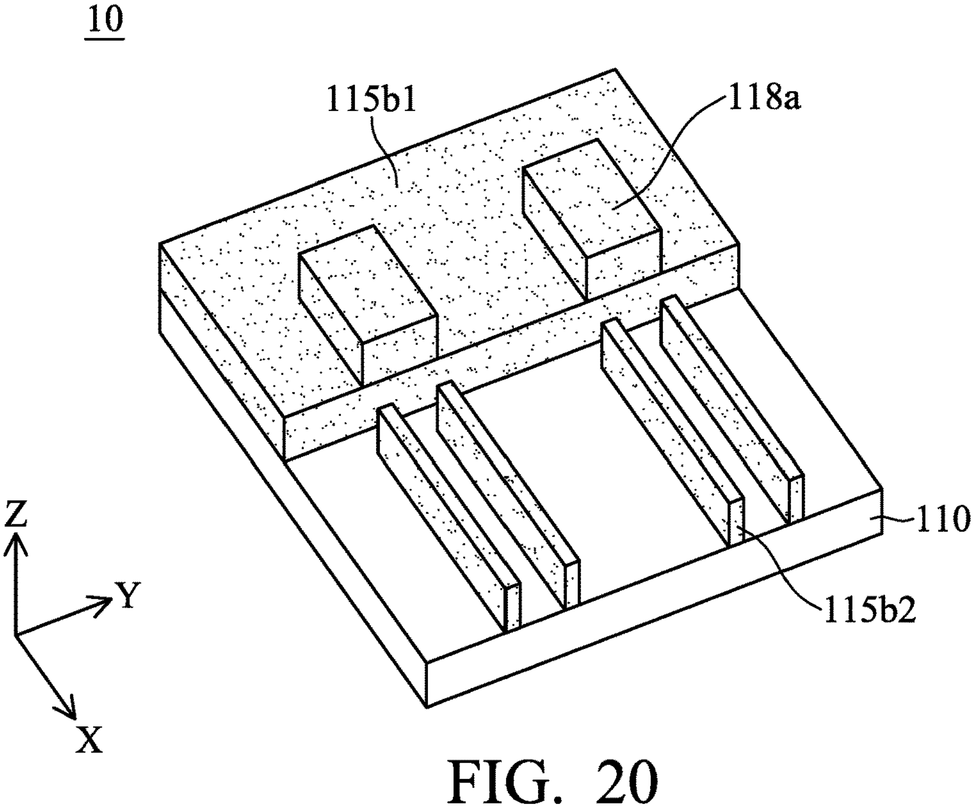
Figure 21A:
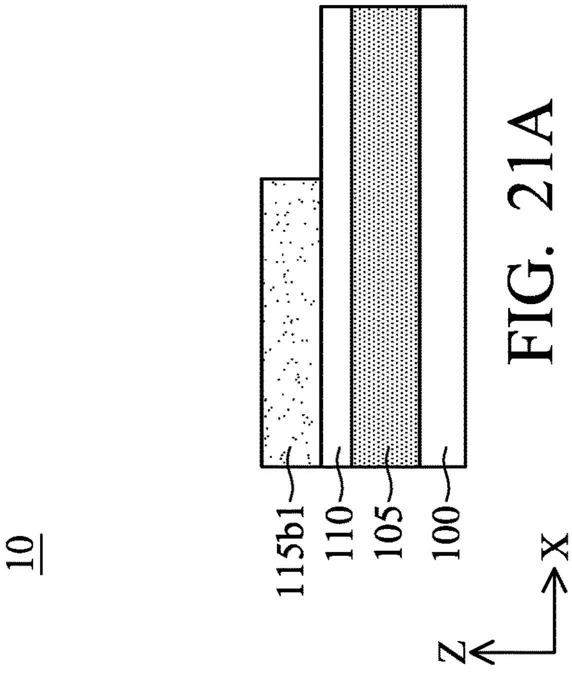
Figure 21B:
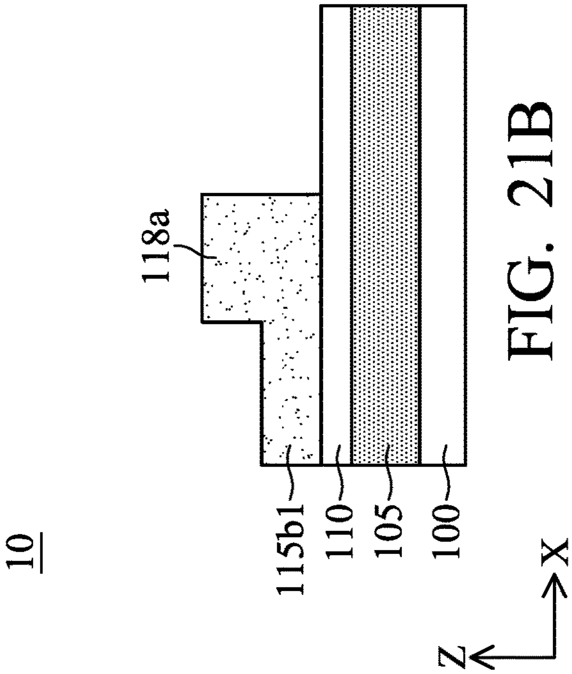
Figure 21C:
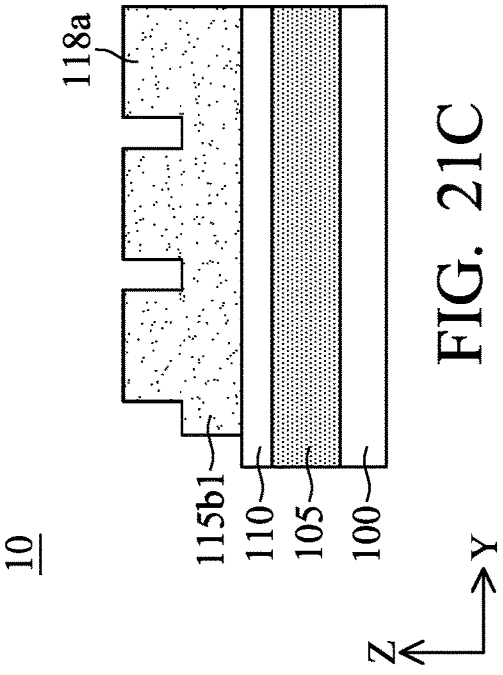
Figure 21D:
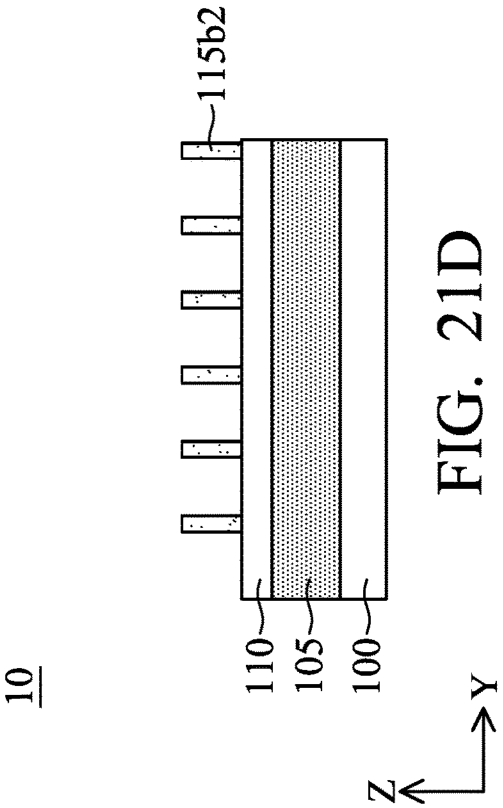

Next, refer to FIG. 19 and in conjunction with FIGS. 20 and 21A~21D. FIGS. 21A, 21B, 21C, and 21D illustrate cross-sectional views of the memory device 10 corresponding to the cross-sectional line A-A, cross-sectional line B-B, cross-sectional line C-C, and cross-sectional line D-D of FIG. 19, respectively, according to the embodiments of the present disclosure. The spacer pattern 135*b* is transferred to the hard mask layer 115*a*, the hard mask layer 115*a* is below the spacer pattern 135*b*, and the second patterned photoresist 155 and all of the spacer patterns 135*b* are removed to form the hard mask layer 115*b* on the sacrificial layer 110. The hard mask layer 115*b* includes a dummy structure pattern 115*b*1 and a word line structure pattern 115*b*2, which are used to correspondingly form the dummy structure 200 and the word line structure 300 on the substrate, respectively. The dummy structure pattern 115*b*1 includes a portion of the hard mask layer 115*a* corresponding to the first mandrel 122 and the protrusion 118, as illustrated in FIGS. 21A, 21B, and 21C. The word line pattern 115*b*2 includes a portion of the hard mask layer 115*a* corresponding to the third patterns 141*b*, as illustrated in FIG. 21D. It should be noted that, as illustrated in FIGS. 21A, 21B, and 21C, although the dummy structure pattern 115*b*1 includes the sub-protrusion 118*a*, the dummy structure 200 with flat top surface may still be formed on the substrate 100. That is, after transferring the dummy structure pattern 115*b*1 to the stack layer 105, due to the difference in etch selectivity between the hard mask layer 115*bi* and the stack layer 105, the dummy structure 200 may still be formed with flat top surface.

Figure 22:
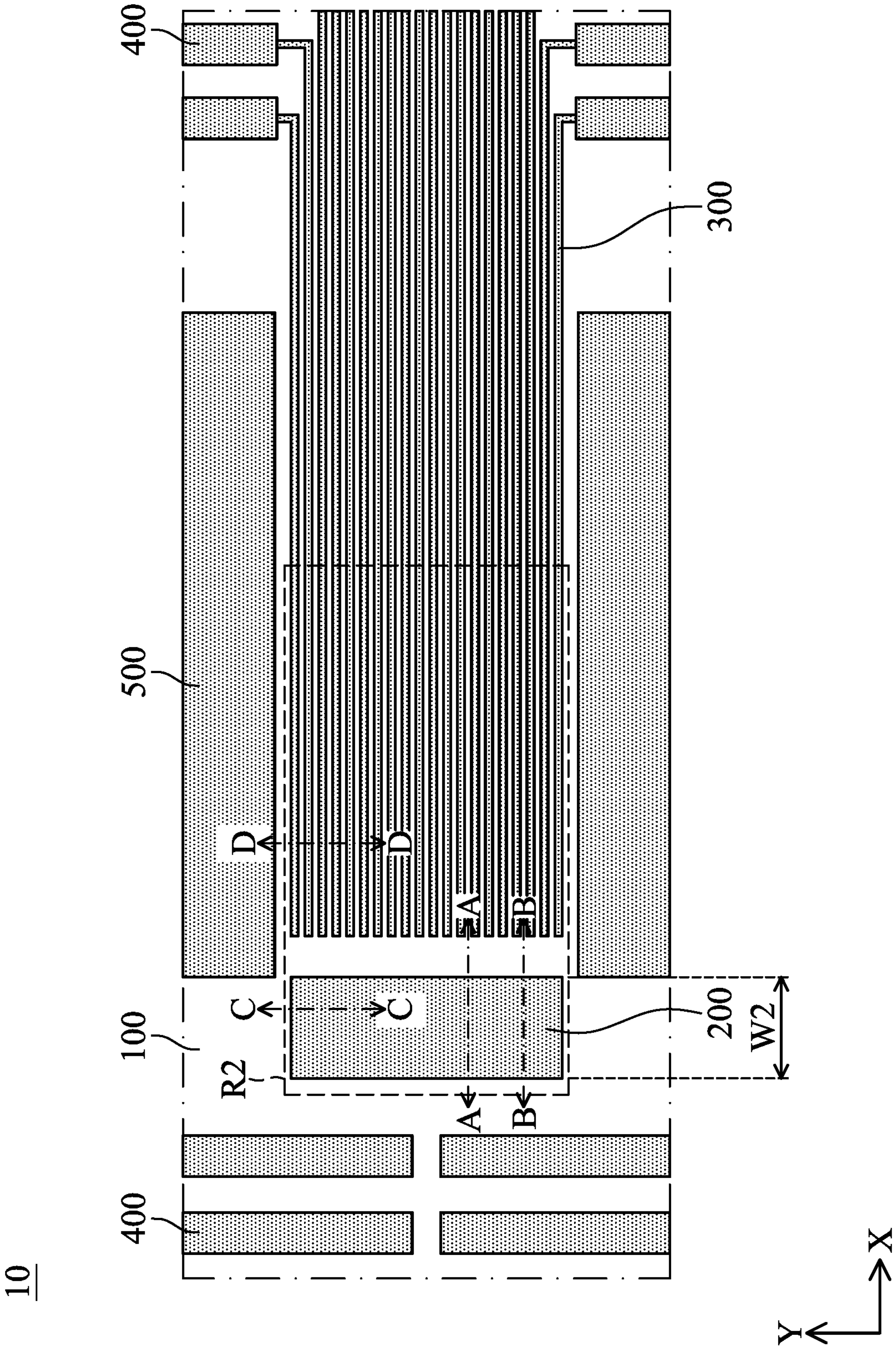
Figure 23A:
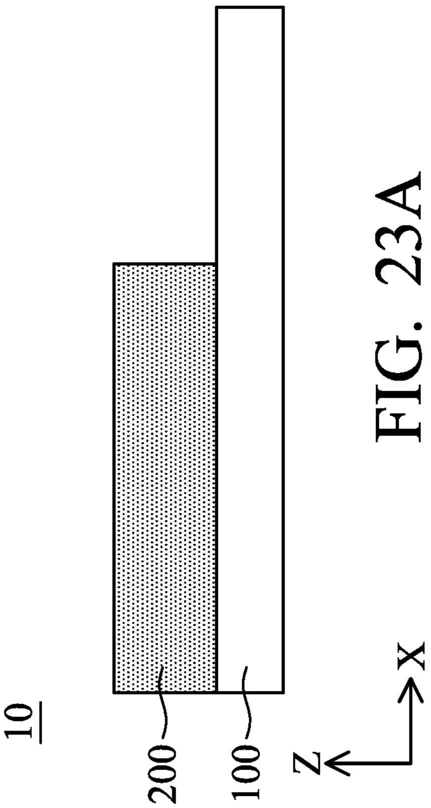
Figure 23B:
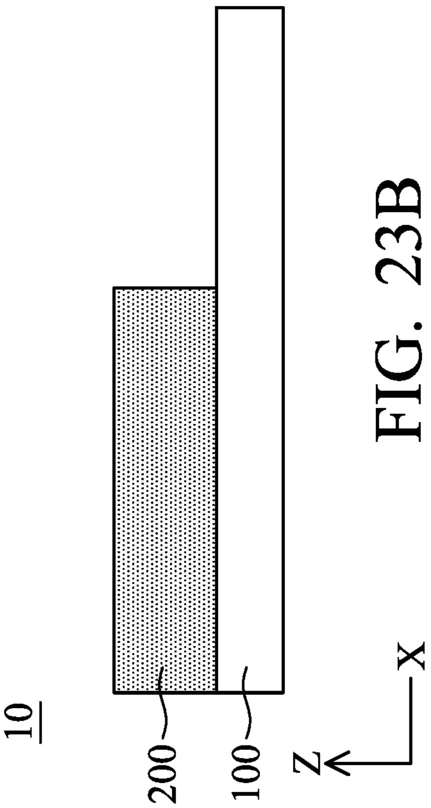
Figure 23C:
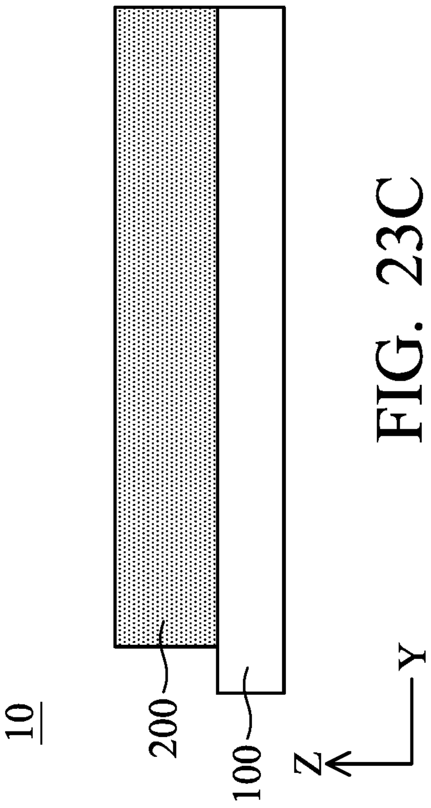
Figure 23D:
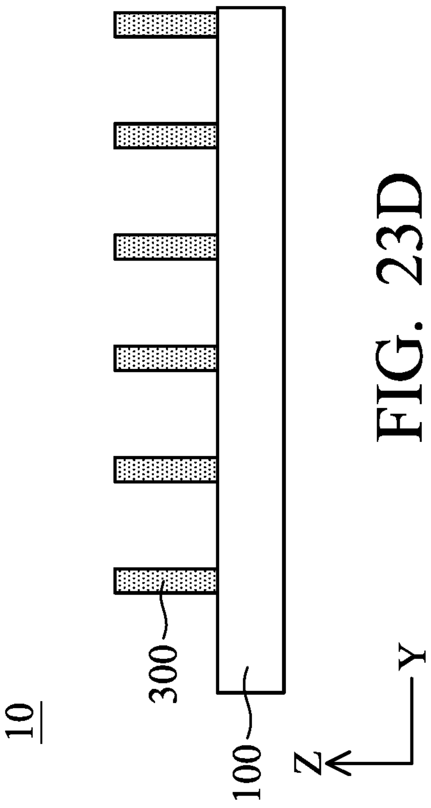

Subsequently, refer to FIG. 22 and in conjunction with FIGS. 23A~23D. FIGS. 23A, 23B, 23C, and 23D illustrate cross-sectional views of the memory device 10 corresponding to the cross-sectional line A-A, cross-sectional line B-B, cross-sectional line C-C, and cross-sectional line D-D of FIG. 22, respectively, according to the embodiments of the present disclosure. Using the dummy structure pattern 115*b*1 and the word line structure pattern 115*b*2 as a mask, the sacrificial layer 110 and the stacking layer 105 are sequentially etched, and the dummy structure pattern **115*b*1, the word line structure pattern 115*b*2, and the sacrificial layer 110 are subsequently removed to form the dummy structure 200 and the word line structure 300 on the substrate 100. In FIG. 22, the region R2 corresponds to the region of the top view illustrated in FIGS. 1A, 2, 5, 7, 9, 12, 14, 17, and 19. The dummy structure pattern 115*b*1 correspondingly forms the dummy structure 200, and the word line structure pattern 115*b*2 correspondingly forms the word line structure 300. As the protrusion 118 is formed, the dummy structure 200 may be a solid block extending along the first direction (e.g., the coordinate axis Y direction), as illustrated in FIGS. 22, 23A, 23B, and 23C. The word line structure 300 extends along the second direction and is arranged in the first direction, as illustrated in FIGS. 22 and 23D. In some embodiments, the dummy structure 200 is separated from the word line structure 300 by a distance that is within a range of about 80 nm to about 100 nm. In some embodiments, the third patterns 141*b* are separated from each other by a distance that is equal to the pitch of the word line structure 300. In some embodiments, the ratio of the width W1 of the protrusion 118 in the second direction to the width W2 of the dummy structure 200** in the second direction ranges from 1:2 to 1:2.2.

After forming the dummy structure 200 and the word line structure 300, other semiconductor processes may be performed continuously to form various features and components of the memory device 10, such as forming the landing pad 400 and the select gate 500 illustrated in FIG. 22, or performing further implantation processes, which will not be repeated herein.

In summary, the embodiments of the present disclosure allows the final dummy structure 200 not to have a comb-shaped structure. That is, the dummy structure 200 is formed as a solid block by forming a hard mask layer with a specific pattern (e.g., a protrusion). Therefore, the subsequent dielectric filling process does not undesirably form an air gap in the dummy structure 200, and avoids the possibility of leaving chemical residue in the air gap in the dummy structure 200 during the subsequent cleaning process, so as to maintain the yields of the memory device.

One aspect of the present disclosure provides a method of manufacturing a memory device, including providing a substrate; forming a stack layer on the substrate; and forming a hard mask layer on the stack layer. The hard mask layer has a protrusion, and the protrusion extends in a first direction. The method further includes forming a patterned mandrel on the hard mask layer. The patterned mandrel includes a first mandrel extending in the first direction and disposed adjacent to the protrusion. The patterned mandrel includes a second mandrel disposed on the top surface of the protrusion. The patterned mandrel includes a third mandrel extending in a second direction. The first and second directions intersect. The method further includes using the patterned mandrel as a mask, and sequentially patterning the hard mask layer and the stack layer to form a dummy structure and a word line structure separated from each other on the substrate. The portion of the stack layer corresponding to the first and second mandrels is formed as the dummy structure. The portion of the stack layer corresponding to the third mandrel is formed as the word line structure.

In some embodiments, the first mandrel of the patterned mandrel is connected to the third mandrel by the second mandrel. In some embodiments, the sequentially patterning of the hard mask layer and the stack layer includes forming a spacer pattern on sidewalls of the patterned mandrel; transferring the patterned mandrel and the spacer pattern to the hard mask layer and removing the patterned mandrel to leave the spacer pattern on the hard mask layer; and sequentially transferring the spacer pattern to the hard mask layer and the stack layer to form the dummy structure and the word line structure on the substrate. In some embodiments, transferring the patterned mandrel and the spacer pattern to the hard mask layer further includes removing the portion of the protrusion exposed by the patterned mandrel and the spacer pattern to leave a sub-protrusion. In some embodiments, the sidewall of the sub-protrusion in the second direction is aligned with the sidewall of the dummy structure in the second direction. In some embodiments, after forming the spacer pattern, the top surface of the portion of the spacer pattern correspondingly formed on a sidewall of the third mandrel is aligned with the top surface of the protrusion. In some embodiments, after leaving the spacer pattern on the hard mask layer, the top surface of the portion of the spacer pattern correspondingly formed over the third mandrel is lower than the top surface of the protrusion. In some embodiments, sequentially transferring the spacer pattern to the hard mask layer and the stack layer further includes removing the first pattern and the second pattern of the spacer pattern correspondingly formed on sidewalls of the first mandrel and the second mandrel to leave a third pattern of the spacer pattern correspondingly formed on sidewalls of the third mandrel; transferring the third pattern to the hard mask layer below the third pattern; removing the spacer pattern; and transferring the pattern of the hard mask layer to the stack layer. In some embodiments, the third patterns are not connected to each other, and the third patterns are separated from each other by a distance that is equal to the pitch of the word line structure.

In some embodiments, the formation of the hard mask layer further includes partially patterning the hard mask layer, thereby forming the hard mask layer with the protrusion. In some embodiments, before forming the hard mask layer on the stack layer, a sacrificial layer is formed on the stack layer, wherein the sacrificial layer protects the stack layer from being etched during the patterning of the hard mask layer. In some embodiments, the hard mask layer includes polycrystalline silicon, and the material of the patterned mandrel comprises carbon, silicon oxynitride (SiON), bottom anti-reflective coating (BARC), or a combination thereof. In some embodiments, the dummy structure is a solid block extending in the first direction. In some embodiments, the top surface of the protrusion is level with the top surface of the first mandrel and the third mandrel of the patterned mandrel.

In some embodiments, the width of the protrusion in the second direction is from about 210 nm to about 230 nm. In some embodiments, the ratio of the width of the protrusion in the second direction to the width of the first mandrel in the second direction is 1:1 to 1:1.1. In some embodiments, the thickness of the protrusion is from about 120 nm to about 130 nm. In some embodiments, the ratio of the thickness of the protrusion to the thickness of the hard mask layer is 0.6:1 to 0.5:1. In some embodiments, the distance between the dummy structure and the word line structure is from about 80 nm to about 100 nm. In some embodiments, the ratio of the width of the protrusion in the second direction to the width of the dummy structure in the second direction is 1:2 to 1:2.2.

The scope of the present disclosure is not limited to the technical solutions consisting of specific combinations of the technical features described above, but should also cover other technical solutions consisting of any combinations of the technical features described above or their equivalent features, all of which are within the scope of the protection of the present disclosure.

The foregoing outlines features of several embodiments of the present disclosure so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a memory device, comprising:

providing a substrate;

forming a stack layer on the substrate;

forming a hard mask layer on the stack layer, wherein the hard mask layer has a protrusion, wherein the protrusion extends in a first direction;

forming a patterned mandrel on the hard mask layer, wherein the patterned mandrel comprises:

a first mandrel extending in the first direction and disposed adjacent to the protrusion;

a second mandrel disposed on a top surface of the protrusion; and a third mandrel extending in a second direction, wherein the first direction intersects the second direction; and using the patterned mandrel as a mask, sequentially patterning the hard mask layer and the stack layer to form a dummy structure and a word line structure separated from each other on the substrate, wherein a portion of the stack layer corresponding to the first and second mandrels is formed as the dummy structure, and a portion of the stack layer corresponding to the third mandrel is formed as the word line structure.

2. The method as claimed in claim 1, wherein the first mandrel of the patterned mandrel is connected to the third mandrel by the second mandrel.

3. The method as claimed in claim 1, wherein the sequentially patterning of the hard mask layer and the stack layer comprises:

forming a spacer pattern on sidewalls of the patterned mandrel;

transferring the patterned mandrel and the spacer pattern to the hard mask layer and removing the patterned mandrel to leave the spacer pattern on the hard mask layer; and sequentially transferring the spacer pattern to the hard mask layer and the stack layer to form the dummy structure and the word line structure on the substrate.

4. The method as claimed in claim 3, wherein transferring the patterned mandrel and the spacer pattern to the hard mask layer further comprises:

removing a portion of the protrusion exposed by the patterned mandrel and the spacer pattern to leave a sub-protrusion.

5. The method as claimed in claim 4, wherein a sidewall of the sub-protrusion in the second direction is aligned with a sidewall of the dummy structure in the second direction.

6. The method as claimed in claim 3, wherein after forming the spacer pattern, a top surface of a portion of the spacer pattern correspondingly formed on a sidewall of the third mandrel is aligned with the top surface of the protrusion.

7. The method as claimed in claim 3, wherein after leaving the spacer pattern on the hard mask layer, a top surface of a portion of the spacer pattern correspondingly formed over the third mandrel is lower than the top surface of the protrusion.

8. The method as claimed in claim 3, wherein sequentially transferring the spacer pattern to the hard mask layer and the stack layer further comprises:

removing a first pattern and a second pattern of the spacer pattern correspondingly formed on sidewalls of the first mandrel and the second mandrel to leave a plurality of third pattern of the spacer pattern correspondingly formed on sidewalls of the third mandrel;

transferring the third patterns to the hard mask layer below the third patterns;

removing the spacer pattern; and transferring the pattern of the hard mask layer to the stack layer.

9. The method as claimed in claim 8, wherein the third patterns are not connected to each other, and wherein the third patterns are separated from each other by a distance equal to a pitch of the word line structure.

10. The method as claimed in claim 1, wherein the formation of the hard mask layer further comprises:

partially patterning the hard mask layer, thereby forming the hard mask layer with the protrusion.

11. The method as claimed in claim 1, wherein before forming the hard mask layer on the stack layer, the method further comprises:

forming a sacrificial layer on the stack layer, wherein the sacrificial layer protects the stack layer from being etched during the patterning of the hard mask layer.

12. The method as claimed in claim 1, wherein the hard mask layer comprises polycrystalline silicon, and a material of the patterned mandrel comprises carbon, silicon oxynitride (SiON), bottom anti-reflective coating (BARC), or a combination thereof.

13. The method as claimed in claim 1, wherein the dummy structure is a solid block extending in the first direction.

14. The method as claimed in claim 1, wherein the top surface of the protrusion is level with a top surface of the first mandrel and the third mandrel of the patterned mandrel.

15. The method as claimed in claim 1, wherein a width of the protrusion in the second direction is from about 210 nm to about 230 nm.

16. The method as claimed in claim 1, wherein a ratio of the width of the protrusion in the second direction to a width of the first mandrel in the second direction is 1:1 to 1:1.1.

17. The method as claimed in claim 1, wherein a thickness of the protrusion is from about 120 nm to about 130 nm.

18. The method as claimed in claim 1, wherein a ratio of a thickness of the protrusion to a thickness of the hard mask layer is 0.6:1 to 0.5:1.

19. The method as claimed in claim 1, wherein a distance between the dummy structure and the word line structure is from about 80 nm to about 100 nm.

20. The method as claimed in claim 1, wherein a ratio of a width of the protrusion in the second direction to a width of the dummy structure in the second direction is 1:2 to 1:2.2.

* * * * *